US009369118B2

(12) United States Patent
Nakata

(10) Patent No.: US 9,369,118 B2
(45) Date of Patent: Jun. 14, 2016

(54) DUTY CYCLE CORRECTION CIRCUIT AND SEMICONDUCTOR DEVICE

(71) Applicant: Kabushiki Kaisha Toshiba, Minato-ku (JP)

(72) Inventor: Masashi Nakata, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/484,908

(22) Filed: Sep. 12, 2014

(65) Prior Publication Data

US 2016/0013785 A1    Jan. 14, 2016

Related U.S. Application Data

(60) Provisional application No. 62/023,630, filed on Jul. 11, 2014.

(51) Int. Cl.
*H03K 3/017* (2006.01)
*H03K 5/07* (2006.01)
*H03K 7/08* (2006.01)
*H03K 5/156* (2006.01)
*H03K 5/04* (2006.01)

(52) U.S. Cl.
CPC .............. *H03K 5/1565* (2013.01); *H03K 3/017* (2013.01); *H03K 5/04* (2013.01); *H03K 5/07* (2013.01); *H03K 7/08* (2013.01)

(58) Field of Classification Search
CPC ........... H03K 3/017; H03K 5/04–5/07; H03K 5/1565; H03K 7/08
See application file for complete search history.

(56) References Cited

U.S. PATENT DOCUMENTS

| 6,670,838 | B1 * | 12/2003 | Cao ....................... | H03K 5/1565 327/175 |
| 6,897,696 | B2 * | 5/2005 | Chang .................. | H03K 5/1565 327/175 |
| 7,292,499 | B2 * | 11/2007 | Byun ....................... | G11C 7/22 365/149 |
| 7,425,857 | B2 * | 9/2008 | Confalonieri .......... | H03H 11/26 327/264 |
| 7,518,425 | B2 * | 4/2009 | Heightley ............ | H03K 5/1565 327/172 |
| 7,777,543 | B2 | 8/2010 | Park | |
| 8,106,696 | B2 * | 1/2012 | Kikuchi ............... | H03K 5/1565 327/175 |
| 2009/0091354 | A1 * | 4/2009 | Aoki .................... | H03K 5/1565 327/65 |

FOREIGN PATENT DOCUMENTS

| JP | 3-166813 | 7/1991 |
| JP | 2003-304144 | 10/2003 |
| JP | 2011-77426 | 4/2011 |

* cited by examiner

*Primary Examiner* — Patrick O'Neill
(74) *Attorney, Agent, or Firm* — Oblon, McClelland, Maier & Neustadt, L.L.P

(57) ABSTRACT

According to one embodiment, there is provided a duty cycle correction circuit including an input inverter, an output inverter, a charge distribution unit, and a drawing-off unit. The input inverter includes a PMOS transistor and an NMOS transistor and receives a clock signal. The output inverter outputs a clock signal according to a signal transmitted via a signal line from the input inverter. The charge distribution unit distributes, when one transistor of the PMOS transistor and the NMOS transistor is turned on, charge to capacitance elements selected from among one or more first capacitance elements placed on side of the signal line and among a plurality of second capacitance elements disposed on side of source of the one transistor. The drawing-off unit draws off the distributed charge from the selected capacitance elements while the one transistor is maintained to be on.

20 Claims, 14 Drawing Sheets

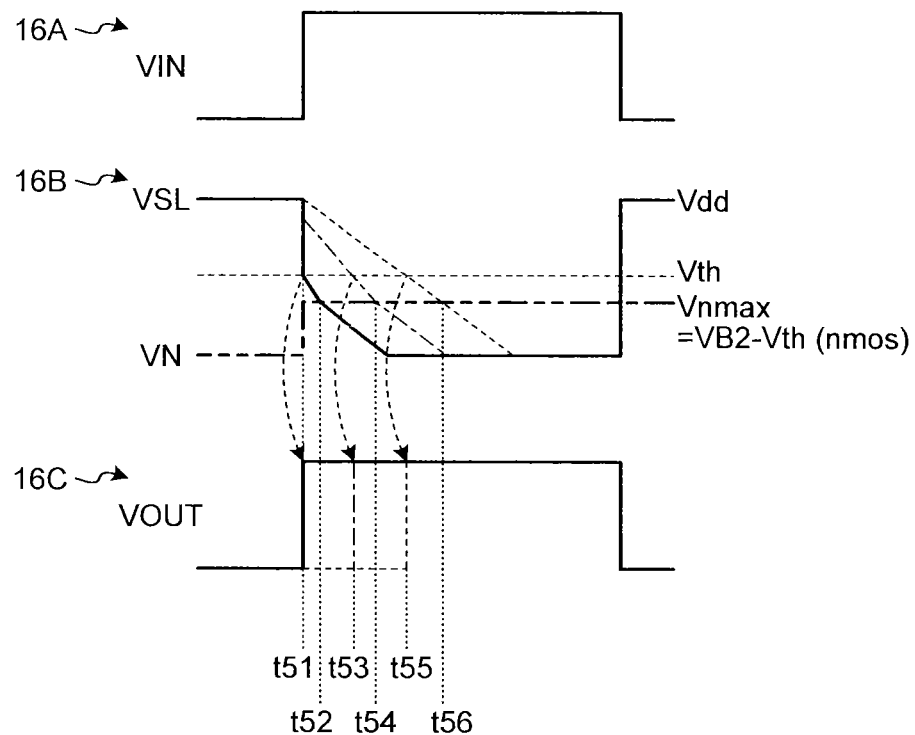

DUTY CYCLE CORRECTION CIRCUIT AND SEMICONDUCTOR DEVICE

CROSS-REFERENCE TO RELATED APPLICATIONS

This application is based upon and claims the benefit of priority from U.S. Provisional Application No. 62/023,630, filed on Jul. 11, 2014; the entire contents of which are incorporated herein by reference.

FIELD

Embodiments described herein relate generally to a duty cycle correction circuit and a semiconductor device.

BACKGROUND

In semiconductor devices, a memory interface transmits a clock signal to a memory and receives a data strobe signal according to the transmitted clock signal from the memory. Further, the memory interface reads a data signal from the memory synchronously with the received data strobe signal. At this time, in order to avoid an error in reading the data signal, the duty ratio of the data strobe signal needs to be at a proper value.

BRIEF DESCRIPTION OF THE DRAWINGS

FIG. 16 is a diagram showing the operation of the duty cycle correction circuit according to the sixth embodiment.

DETAILED DESCRIPTION

Figure 1:
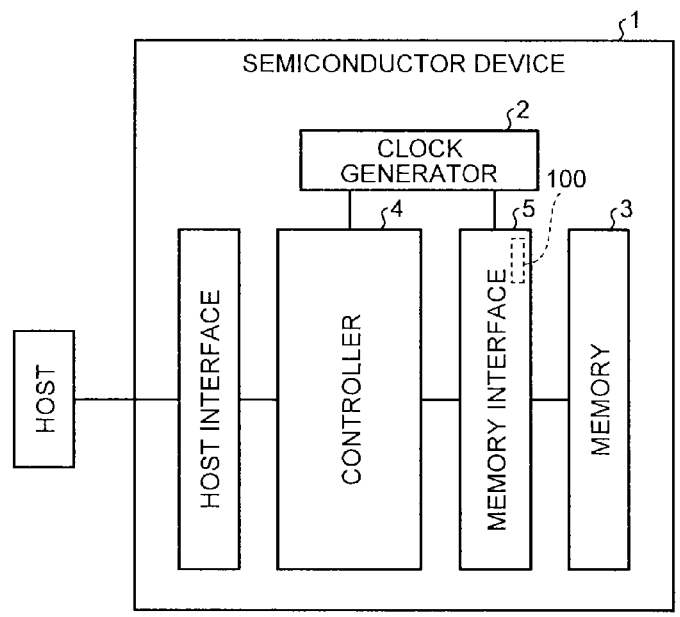
FIG. 1 is a diagram showing the configuration of a semiconductor device including a duty cycle correction circuit according to a first embodiment.

In general, according to one embodiment, there is provided a duty cycle correction circuit including an input inverter, an output inverter, a charge distribution unit, and a drawing-off unit. The input inverter includes a PMOS transistor and an NMOS transistor and receives a clock signal. The output inverter outputs a clock signal according to a signal transmitted via a signal line from the input inverter. The charge distribution unit distributes, when one transistor of the PMOS transistor and the NMOS transistor is turned on, charge to capacitance elements selected from among one or more first capacitance elements placed on side of the signal line and among a plurality of second capacitance elements disposed on side of source of the one transistor. The drawing-off unit draws off the distributed charge from the selected capacitance elements while the one transistor is maintained to be on.

Exemplary embodiments of a duty cycle correction circuit will be explained below in detail with reference to the accompanying drawings. The present invention is not limited to the following embodiments.

First Embodiment

Figure 2:
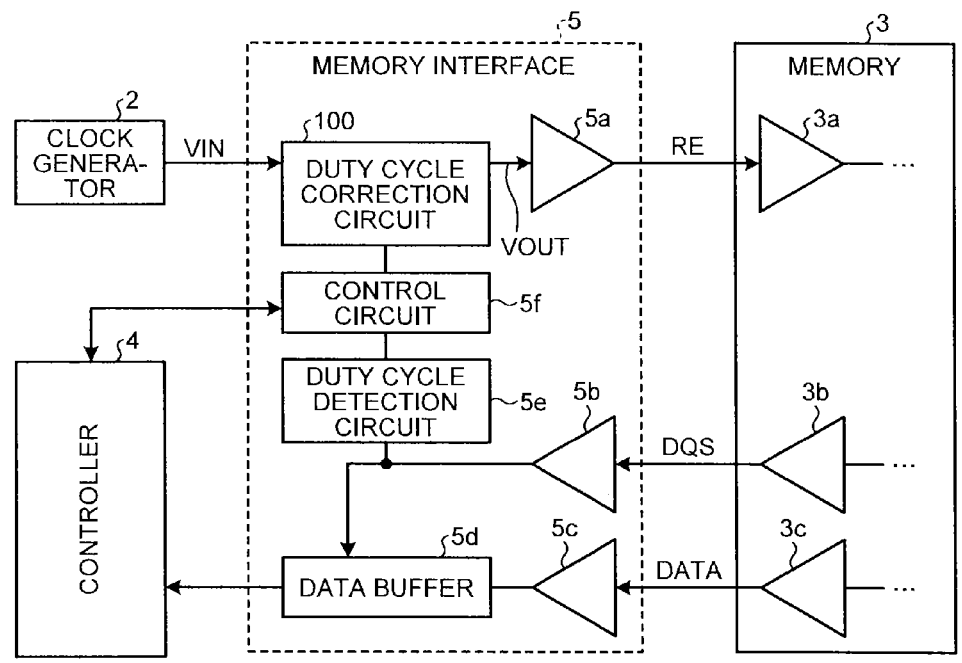
FIG. 2 is a diagram showing the configuration of the semiconductor device including the duty cycle correction circuit according to the first embodiment.

A duty cycle correction circuit 100 according to the first embodiment will be described using FIGS. 1 and 2. FIGS. 1 and 2 are diagrams showing the configuration of a semiconductor device 1 including the duty cycle correction circuit 100.

The semiconductor device 1 comprises a memory 3, a controller 4, a clock generator 2, and a memory interface 5 as shown in FIG. 1. The duty cycle correction circuit 100 is included in the memory interface 5.

The memory 3 is a memory in which an operation for a command is performed synchronously with a double edge of a clock signal and compliant with a standard such as DDR (Double-Data-Rate), DDR2, DDR3, LPDDR (Low Power Double-Data-Rate), or LPDDR2. The memory 3 may be a nonvolatile memory such as a NAND flash memory or a volatile memory such as an SDRAM (Synchronous Dynamic Random Access Memory).

According to the DDR (Double-Data-Rate) scheme, data are read at a double edge of rising and falling of a data strobe signal generated based on the clock signal, and thus the transfer rate (double data rate) that is twice as high as in the case of reading data at only the rising edge of the data strobe signal is realized.

The controller 4 controls the components of the semiconductor device 1 comprehensively. The clock generator 2 generates a clock signal VIN to supply to the memory interface 5. The memory interface 5 transmits a clock signal RE to the memory 3 and receives, from the memory 3, a data strobe signal DQS according to the transmitted clock signal RE. Further, the memory interface reads a data signal DATA from the memory 3 synchronously with the received data strobe signal DQS.

For example, the clock generator 2, the controller 4, and the memory interface 5 are mounted on the same substrate, and the memory 3 is mounted on a substrate separate from it. Because of being mounted in this way, the memory 3 is subject to various influences including the influences of temperature variation, voltage variation, process variation, production variation of the enclosure (package), and production variation of the print circuit board (PCB)), etc., depending on its mounting condition. Hence, variation in the duty ratio of the data strobe signal DQS generated in the memory 3 and transmitted to the memory interface 5 is likely to be large. At this time, in order to avoid an error in reading the data signal DATA in the memory interface 5, the duty ratio of the data strobe signal DQS needs to be corrected to be at an appropriate value (e.g., an optimum duty ratio of 50%). This can be achieved by adjusting the duty ratio of the clock signal RE to be transmitted to the memory 3, and the adjustment amount needs to be accurate and appropriate.

The adjustment of the duty ratio is performed in the memory interface 5 as shown in FIG. 2. The memory interface 5 has a duty cycle correction circuit 100, a driver 5a, a receiver 5b, a receiver 5c, a data buffer 5d, a duty cycle detection circuit 5e, and a control circuit 5f. The clock signal RE is transmitted via the driver 5a to the memory 3, and the memory 3 operates synchronously with a double edge of rising and falling of the clock signal RE received by a receiver 3a. Further, the memory 3 generates the data strobe signal DQS whose duty cycle is related to the clock signal RE and transmits via a driver 3b to the memory interface 5. The receiver 5b transmits the received data strobe signal DQS to the data buffer 5d and the duty cycle detection circuit 5e.

Further, the memory 3 transmits the data signal DATA via a driver 3c to the memory interface 5. The receiver 5c transmits the data signal DATA received from the memory 3 to the data buffer 5d. The data buffer 5d reads the data signal DATA from the memory 3 synchronously with a double edge of rising and falling of the data strobe signal DQS. The data buffer 5d supplies the read data signal DATA to the controller 4.

The duty cycle detection circuit 5e detects the duty ratio of the data strobe signal DQS. The duty cycle detection circuit 5e supplies the detecting result to the control circuit 5f.

The control circuit 5f, under the control of the controller 4, controls the operation of the duty cycle correction circuit 100 so that the duty ratio detected by the duty cycle detection circuit 5e takes on a target value (e.g., an optimum duty ratio of 50%). For example, the control circuit 5f generates an n+1 bit control signal φS[0:n] and an n+1 bit control signal φN[0:n] to supply to the duty cycle correction circuit 100 so that the duty ratio detected by the duty cycle detection circuit 5e takes on the target value, where n is an integer of two or greater.

The duty cycle correction circuit 100 receives the clock signal from the clock generator 2. The duty cycle correction circuit 100 adjusts the duty ratio of the clock signal according to control by the control circuit 5f and supplies a clock signal VOUT after the duty cycle adjustment to the driver 5a. For example, the duty cycle correction circuit 100 adjusts the duty ratio of the clock signal according to the n+1 bit control signal φS[0:n] and the n+1 bit control signal φN[0:n] received from the control circuit 5f. At this time, if the adjustment amount of the duty ratio of the clock signal by the duty cycle correction circuit 100 changes nonlinearly according to the n+1 bit control signal φS[0:n] and the n+1 bit control signal φN[0:n], then it is difficult to adjust the duty ratio of the clock signal to be at an appropriate value.

Accordingly, the first embodiment implements the following new means so that the duty cycle correction circuit 100 adjusts the duty ratio of the clock signal linearly.

Figure 3:
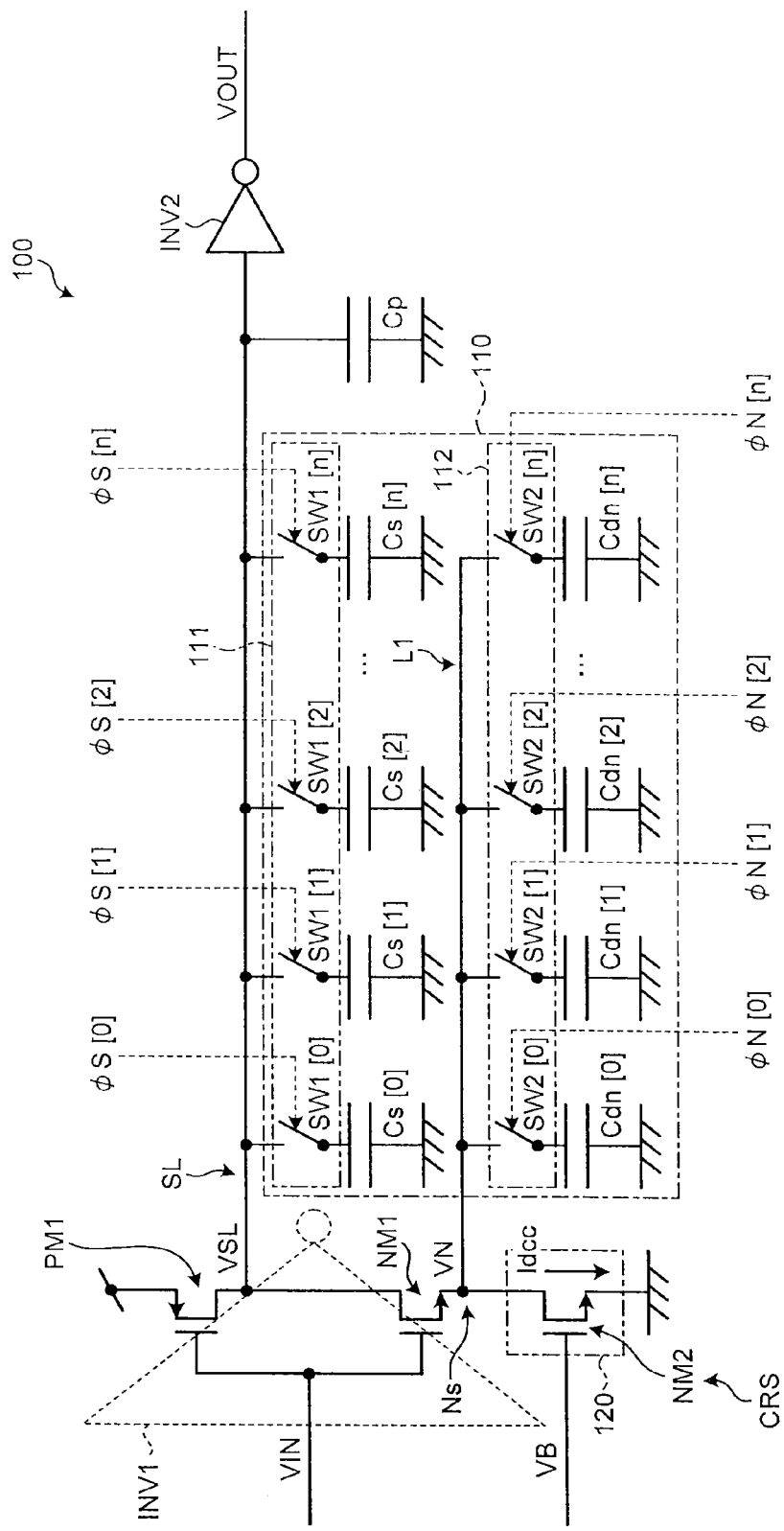
FIG. 3 is a diagram showing the configuration of the duty cycle correction circuit according to the first embodiment.

Specifically, the duty cycle correction circuit 100 has an input inverter INV1, an output inverter INV2, a charge distribution unit 110, and a drawing-off unit 120 as shown in FIG. 3.

The input inverter INV1 receives the clock signal VIN from the clock generator 2 (see FIG. 2). The input inverter INV1 generates a signal (voltage VSL) obtained by logically inverting the clock signal VIN to supply via a signal line SL to the output inverter INV2. The output inverter INV2 generates the clock signal VOUT obtained by logically inverting the signal (voltage VSL) in response to a change of the level of the received signal (voltage VSL) upward or downward over a circuit threshold Vth (see FIG. 4B). The output inverter INV2 outputs the clock signal VOUT to the driver 5a (see FIG. 2).

Figure 4:
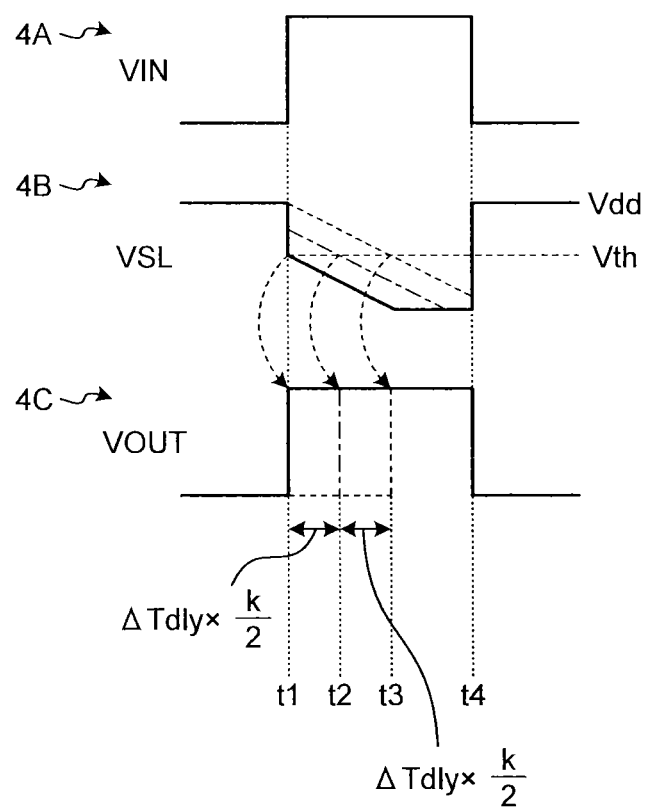
FIG. 4 is a diagram showing the operation of the duty cycle correction circuit according to the first embodiment.

At this time, the charge distribution unit 110 and the drawing-off unit 120 are configured to delay the rising edge timing of the clock signal VIN by a linear delay amount according to the n+1 bit control signal φS[0:n] and the n+1 bit control signal φN[0:n] (see FIG. 4).

The charge distribution unit 110 distributes charge (positive charge) to selected ones of multiple capacitance elements Cs[0] to Cs[n] and multiple capacitance elements Cdn[0] to Cdn[n] when an NMOS transistor NM1 is turned on. For example, the charge distribution unit 110 has the multiple capacitance elements (first capacitance elements) Cs[0] to Cs[n], a selecting unit (first selecting unit) 111, the multiple capacitance elements (second capacitance elements) Cdn[0] to Cdn[n], and a selecting unit (second selecting unit) 112.

It should be noted that the term "distributing charge" (charge distributing operation) includes changing the storage amount of at least one of the positive charge and negative charge in each electrode by moving charge between electrodes of the capacitance elements Cs[0] to Cs[n] and electrodes of the capacitance elements Cdn[0] to Cdn[n]. Further, the term "distributing charge" (charge distributing operation) also includes changing, by a substantially zero change amount, the storage amount of each of the positive charge and negative charge in each electrode when there is almost no charge movement between electrodes of the capacitance elements Cs[0] to Cs[n] and electrodes of the capacitance elements Cdn[0] to Cdn[n].

The selecting unit 111 selects capacitance elements Cs to be used for adjustment of the rising edge timing of the clock signal from among the multiple capacitance elements Cs[0] to Cs[n] to connect to the signal line SL. The selecting unit 111 has multiple switches (first switches) SW1[0] to SW1[n].

The capacitance elements Cs[0] to Cs[n] correspond to the switches SW1[0] to SW1[n]. Each capacitance element Cs[0] to Cs[n] has one end connected to a corresponding switch SW1 and the other end connected to a reference potential (e.g., ground potential).

The switches SW1[0] to SW1[n] correspond to the n+1 bit control signal φS[0:n]. Each switch SW1[0] to SW1[n] turns on when receiving the control signal φS of an active level (e.g., H level) at its control terminal and turns off when receiving the control signal φS of a non-active level (e.g., L level) at its control terminal. Thus, the switches SW1[0] to SW1[n] connect capacitance elements Cs of the multiple capacitance elements Cs[0] to Cs[n] that are selected according to the n+1 bit control signal φS[0:n] to the signal line SL. Therefore, the storage and distribution of charge can be performed using selected capacitance Cs when the NMOS transistor NM1 is turned on and off.

The selecting unit 112 selects capacitance elements Cdn to be used for adjustment of the rising edge timing of the clock signal from among the multiple capacitance elements Cdn[0] to Cdn[n] to connect via a line L1 to a node Ns on the source side of the NMOS transistor NM1. The selecting unit 112 has multiple switches (second switches) SW2[0] to SW2[n].

The capacitance elements Cdn[0] to Cdn[n] correspond to the switches SW2[0] to SW2[n]. Each capacitance element Cdn[0] to Cdn[n] has one end connected to a corresponding switch SW2 and the other end connected to the reference potential (e.g., ground potential).

The switches SW2[0] to SW2[n] correspond to the n+1 bit control signal φN[0:n]. Each switch SW2[0] to SW2[n] turns on when receiving the control signal φN of the active level (e.g., H level) at its control terminal and turns off when receiving the control signal φS of the non-active level (e.g., L level) at its control terminal. Thus, the switches SW2[0] to SW2[n] connect capacitance elements Cdn of the multiple capacitance elements Cdn[0] to Cdn[n] that are selected according to the n+1 bit control signal φN[0:n] via the line L1 to the node Ns. Therefore, charge can be distributed to the selected capacitance elements Cdn when the NMOS transistor NM1 is turned on.

Here, the selecting units 111 and 112 selects capacitance elements to be used for duty cycle adjustment such that the sum of the total capacitance of capacitance elements Cs to be used for duty cycle adjustment and the total capacitance of capacitance elements Cdn to be used for duty cycle adjustment becomes a target value.

For example, the capacitance elements Cs[0] to Cs[n] and the capacitance elements Cdn[0] to Cdn[n] have substantially the same capacitance. The capacitance values of each capacitance element Cs[0] to Cs[n] and of each capacitance element Cdn[0] to Cdn[n] are adjusted to be appropriate values relative to parasitic capacitance Cp. The selecting units 111 and 112 select capacitance elements to be used for duty cycle adjustment such that the sum of the number of capacitance elements Cs to be used for duty cycle adjustment and the number of capacitance elements Cdn to be used for duty cycle adjustment becomes a target number.

For example, the capacitance elements Cs[0] to Cs[n] and the capacitance elements Cdn[0] to Cdn[n] correspond to each other. The selecting units 111 and 112 selects complementarily from the capacitance elements Cs[0] to Cs[n] and the capacitance elements Cdn[0] to Cdn[n] while maintaining the number of selected capacitance elements to be the target number. For example, if the capacitance element Cs[0] is selected, then the capacitance element Cdn[0] is non-selected, and if the capacitance element Cs[n] is non-selected, then the capacitance element Cdn[n] is selected.

The drawing-off unit 120 draws off their distributed charge (positive charge) from selected capacitance elements while the NMOS transistor NM1 is maintained to be turned on. For example, the drawing-off unit 120 has a current source CRS. The current source CRS draws off charge (positive charge) from selected capacitance elements to discharge into the reference potential (e.g., ground). The current source CRS has an NMOS transistor NM2. The NMOS transistor NM2 has its source connected to the reference potential (e.g., ground) and its drain connected to the node Ns. The NMOS transistor NM2 has a bias VB supplied to its gate and functions as the current source CRS.

Note that the term "distributed charge" includes each of the positive charge and negative charge in the electrodes of the capacitance elements Cs[0] to Cs[n] and capacitance elements Cdn[0] to Cdn[n] on which the aforementioned charge distributing operation has been performed.

The current source CRS draws off charge from capacitance elements at a speed (delay amount) according to capacitance that is seen on the drain side, that is, the total capacitance of the selected capacitance elements. Hence, by maintaining the number of selected capacitance elements to be a target number, the speed at which the current source CRS draws off charge can be made constant even between multiple cases different in selected capacitance elements. Thus, the current source CRS can lower the potential on the signal line SL at substantially the same speed between multiple cases different in selected capacitance elements (see FIG. 4B).

Next, the operation of the duty cycle correction circuit 100 will be described using FIG. 4. FIG. 4 is a diagram showing the operation of the duty cycle correction circuit 100. Here, description will be made supposing that the circuit threshold Vth=Vdd/2, but the invention is not limited to this in actual usage.

Immediately before timing t1, the selecting units 111 and 112 selects complementarily from the capacitance elements Cs[0] to Cs[n] and the capacitance elements Cdn[0] to Cdn[n] while maintaining the number of selected capacitance elements to be a target number. Further, immediately before timing t1, the clock signal VIN being input to the input inverter INV1 is at the L level. In the input inverter INV1, the PMOS transistor PM1 is on while the NMOS transistor NM1 is off, so that the potential on the signal line SL is set at a power supply potential Vdd (H level).

At timing t1, as shown in FIG. 4A, when the clock signal VIN being input to the input inverter INV1 rises from the L level to the H level, the PMOS transistor PM1 in the input inverter INV1 is turned off, and the NMOS transistor NM1 is turned on. At this time, charge distribution can be performed according to which capacitance elements are selected by the selecting units 111 and 112, so that the potential on the signal line SL can change to a different value.

For example, cases will be described where the target number is k (k≤n) and where the total capacitance of k number of capacitance elements Cs (Cdn) is the same as Cp.

In case I where k number of capacitance elements Cs are selected with all the capacitance elements Cdn being non-selected, at timing t1, charge distribution is hardly performed, so that the potential on the signal line SL remains at the power supply potential Vdd (H level) without changing, as indicated by a broken line in FIG. 4B. At this time, because the potential on the signal line SL is higher than the circuit threshold Vth, the level of the clock signal VOUT output from the output inverter INV2 remains at the L level as indicated by a broken line in FIG. 4C.

In case II where k/2 number of capacitance elements Cs are selected and k/2 number of capacitance elements Cdn are selected, at timing t1, part of charge stored in the parasitic capacitance Cp of the signal line SL and the k/2 number of capacitance elements Cs moves into the k/2 number of capacitance elements Cdn, thereby performing charge distribution. At this time, the potential on the signal line SL takes on an intermediate value between the power supply potential Vdd and the circuit threshold Vth of the output inverter INV2 (=(Vdd+Vth)/2) as indicated by a dot-dashed line in FIG. 4B. Because the potential on the signal line SL is higher than the circuit threshold Vth, the level of the clock signal VOUT output from the output inverter INV2 remains at the L level as indicated by a dot-dashed line in FIG. 4C.

In case III where all the capacitance elements Cs are non-selected and k number of capacitance elements Cdn are selected, at timing t1, part of charge stored in the parasitic capacitance Cp of the signal line SL moves into the k number of capacitance elements Cdn, thereby performing charge distribution. At this time, the potential on the signal line SL becomes substantially equal to the circuit threshold Vth of the output inverter INV2 as indicated by a solid line in FIG. 4B. Immediately thereafter, the current source CRS draws off charge from the capacitance elements, so that the potential on the SL crosses the circuit threshold Vth of the INV2, and hence the level of the clock signal VOUT output from the output inverter INV2 rises from the L level to the H level as indicated by a solid line in FIG. 4C. That is, assuming that delay due to the input inverter INV1 and the output inverter INV2 are negligible, in case III, the delay amount of the rising timing of the clock signal VOUT relative to the rising timing of the clock signal VIN is substantially zero.

Immediately after timing t1, the current source CRS starts drawing off charge from the parasitic capacitance and the selected capacitance elements to discharge into the reference potential (e.g., ground potential). Excluding the parasitic capacitance, in case I, charge is drawn off from each of k number of capacitance elements Cs. In case II, charge is drawn off from each of k/2 number of capacitance elements Cs and k/2 number of capacitance elements Cdn. In case III, charge is drawn off from each of k number of capacitance elements Cdn. Letting Cp be the capacitance value of the parasitic capacitance Cp and C be the capacitance values of each capacitance element Cs and of each capacitance element Cdn, the total capacitance that is seen on the drain side of the current source CRS is denoted as k×C+Cp in each of cases I to III and substantially the same between cases I to III. Hence, the potential VSL on the signal line SL decreases at substantially the same gradient between cases I to III as indicated by a broken line, a dot-dashed line, and a solid line in FIG. 4B.

At timing t2, in case I, the potential on the signal line SL is higher than the circuit threshold Vth as indicated by the broken line in FIG. 4B. Hence, the level of the clock signal VOUT output from the output inverter INV2 remains at the L level as indicated by the broken line in FIG. 4C.

In case II, because the potential on the signal line SL crosses the circuit threshold Vth as indicated by the dot-dashed line in FIG. 4B, the level of the clock signal VOUT output from the output inverter INV2 rises from the L level to the H level as indicated by the dot-dashed line in FIG. 4C. That is, assuming that delay due to the input inverter INV1 and the output inverter INV2 are negligible, in case II, the delay amount of the rising timing of the clock signal VOUT relative to the rising timing of the clock signal VIN is the time length from timing t1 to timing t2 (=ΔTdly×k/2).

In case III, the potential on the signal line SL has already crossed the circuit threshold Vth in a descending direction as indicated by the solid line in FIG. 4C. Hence, the level of the clock signal VOUT output from the output inverter INV2 is kept at the H level as indicated by the solid in FIG. 4C.

At timing t3, in case I, because the potential on the signal line SL crosses the circuit threshold Vth as indicated by the broken line in FIG. 4B, the level of the clock signal VOUT output from the output inverter INV2 rises from the L level to the H level as indicated by the broken line in FIG. 4C. That is, assuming that delay due to the input inverter INV1 and the output inverter INV2 are negligible, in case I, the delay amount of the rising timing of the clock signal VOUT relative to the rising timing of the clock signal VIN is the time length from timing t1 to timing t3 (=ΔTdly×k).

In case II, the potential on the signal line SL has already crossed the circuit threshold Vth in a descending direction as indicated by the dot-dashed line in FIG. 4C. Hence, the level of the clock signal VOUT output from the output inverter INV2 is kept at the H level as indicated by the dot-dashed in FIG. 4C.

In case III, the potential on the signal line SL has already crossed the circuit threshold Vth in a descending direction as indicated by the solid line in FIG. 4C. Hence, the level of the clock signal VOUT output from the output inverter INV2 is kept at the H level as indicated by the solid in FIG. 4C.

At timing t4, as shown in FIG. 4A, when the clock signal VIN being input to the input inverter INV1 falls from the H level to the L level, the NMOS transistor NM1 in the input inverter INV1 is turned off while the PMOS transistor PM1 is turned on. Accordingly the potential VSL on the signal line SL becomes equal to the power supply potential Vdd (H level) as shown in FIG. 4B. Thus, because the potential on the signal line SL crosses the circuit threshold Vth upward, the level of the clock signal VOUT output from the output inverter INV2 falls from the H level to the L level as indicated by the solid line in FIG. 4C. That is, assuming that delay due to the input inverter INV1 and the output inverter INV2 are negligible, in any of cases I to III, the delay amount of the falling timing of the clock signal VOUT relative to the falling timing of the clock signal VIN is substantially zero.

Here, comparing cases I to III, while maintaining the total number of selected capacitance elements to be k, the number of selected capacitance elements Cdn is increased from zero (case I)→k/2 (case II)→k (case III). Accordingly the delay amount of the rising timing of the clock signal VOUT relative to the rising timing of the clock signal VIN is adjusted linearly, proportionally to the number, from ΔTdly×k (case I)→ΔTdly×k/2 (case II)→zero (case III). That is, the duty ratio of the clock signal VOUT is adjusted linearly, proportionally to the number of selected capacitance elements Cdn.

It should be noted that ΔTdly can be obtained as follows. Letting i be the number of selected capacitance elements Cs, j be the number of selected capacitance elements Cdn, Cs be the capacitance value of the capacitance element Cs, Cdn be the capacitance value of the capacitance element Cdn, and V1 be the potential on the signal line SL immediately after the NM1 is turned on, the following equation 1 holds.

$$(i^*Cs+Cp)^*Vdd = (i^*Cs+j^*Cdn+Cp)^*V1 \qquad \text{Eq. 1}$$

When the equation 1 is solved for V1, the following equation 2 is obtained.

$$V1 = (i^*Cs + Cp)^*Vdd / (i^*Cs + j^*Cdn + Cp) \qquad \text{Eq. 2}$$
$$= (i^*Cs + Cp)^*Vdd / Ctotal$$

Here, letting Idcc denote current flowing through the current source CRS and Tdly denote the delay amount of the rising timing of the clock signal VOUT relative to the rising timing of the clock signal VIN, the following equation 3 holds.

$$Tdly = (V1 - Vth)^*Ctotal / Idcc \qquad \text{Eq. 3}$$
$$= (i^*Cs + Cp)^*Vdd / Idcc - Ctotal^*Vth / Idcc$$

Then, letting Tdly' denote the delay amount when the number of selected capacitance elements Cs is i+1 and the number of selected capacitance elements Cdn is j−1, the following equation 4 holds.

$$Tdly' = ((i+1)^*Cs+Cp)^*Vdd/Idcc - Ctotal^*Vth/Idcc \qquad \text{Eq. 4}$$

The variation width ΔTdly, a delay amount per capacitance element, can be given by the following equation 5 obtained from the equations 3 and 4.

$$\Delta Tdly = Tdly' - Tdly \qquad \text{Eq. 5}$$
$$= Cs^*Vdd / Idcc$$

As expressed in the equation 5, the variation width ΔTdly of the delay amount is an amount that does not depend on the number i of capacitance elements Cs nor the number j of capacitance elements Cdn. That is, it is seen from the equation 5 that the delay amount of the rising timing of the clock signal VOUT relative to the rising timing of the clock signal VIN can be adjusted by variation widths ΔTdly linearly to the number of selected capacitance elements Cdn. The magnitude of the variation width ΔTdly can be controlled through the capacitance value Cs of the capacitance element Cs and the amount Idcc of current flowing through the current source CRS.

Further, the parameters should be adjusted so that V1=Cp*Vdd/Ctotal obtained by substituting i=0 into the equation 2 does not exceed the circuit threshold Vth.

As described above, in the first embodiment, in the duty cycle correction circuit 100, the charge distribution unit 110 distributes charge to selected capacitance elements among the multiple capacitance elements Cs and the multiple capacitance elements Cdn when the NMOS transistor NM1 of the input inverter INV1 is turned on. The drawing-off unit 120 draws off their distributed charge from the selected capacitance elements while the NMOS transistor NM1 is maintained to be on. Thus, the timing at which the potential on the signal line SL crosses the circuit threshold Vth of the output inverter INV2 can be delayed by a linear delay amount according to the total capacitance of selected capacitance elements Cdn. As a result, the rising edge timing of the clock signal output from the output inverter INV2 can be delayed by a linear delay amount, and thus the duty ratio of the clock signal output from the output inverter INV2 can be adjusted linearly.

Thus, the duty cycle correction circuit 100 can set the duty ratio highly accurately by the control signals, and hence it is easy to adjust the duty ratio of the clock signal to be at an appropriate value. That is, the duty ratio of the clock signal RE to be transmitted to the memory 3 can be easily adjusted to be at an offset value (appropriate target value) so that the duty ratio of the data strobe signal DQS received from the memory 3 takes on an appropriate value (e.g., a duty ratio of 50%). This adjustment can be performed without stopping the clock signal. That is, the duty ratio of the clock signal RE can be adjusted to be at an appropriate target value so as not to worsen the skew between the data strobe signal and the data signal, while feeding back during the operation of the semiconductor device 1, and thus in the semiconductor device 1, an error in reading data can be avoided.

Further, in the first embodiment, in the duty cycle correction circuit 100, the charge distribution unit 110 can change the potential VSL on the signal line SL by distributing charge to selected capacitance elements when the NMOS transistor NM1 of the input inverter INV1 is turned on. Therefore, for example, when the capacitance elements are selected so that the delay time is a minimum, the potential VSL on the signal line SL can be lowered steeply to around the circuit threshold Vth of the output inverter INV2. As a result, it is easy to have a wide adjustment range of duty ratios.

Yet further, in the first embodiment, in the charge distribution unit 110 of the duty cycle correction circuit 100, the selecting unit 111 selects capacitance elements Cs to be used for adjustment of edge timings of the clock signal from among the multiple capacitance elements Cs to connect to the signal line SL. The selecting unit 112 selects capacitance elements Cdn to be used for adjustment of edge timings of the clock signal from among the multiple capacitance elements Cdn to connect to the node Ns on the source side of the NMOS transistor NM1. The selecting units 111 and 112 adjust edge timings of the clock signal according to the total capacitance of at least selected capacitance elements Cdn. Thus, the timing at which the potential on the signal line SL crosses the circuit threshold Vth of the output inverter INV2 can be delayed by a linear delay amount according to the total capacitance of at least selected capacitance elements Cdn.

Still further, in the first embodiment, in the charge distribution unit 110 of the duty cycle correction circuit 100, the selecting units 111 and 112 select capacitance elements to be used for duty cycle adjustment such that the sum of the total capacitance of capacitance elements Cs to be used for duty cycle adjustment and the total capacitance of capacitance elements Cdn to be used for duty cycle adjustment can become a target value. For example, where each of the capacitance elements Cs and each of the capacitance elements Cdn have substantially the same capacitance, the selecting units 111 and 112 select capacitance elements to be used for duty cycle adjustment such that the sum of the number of capacitance elements Cs to be used for duty cycle adjustment and the number of capacitance elements Cdn to be used for duty cycle adjustment can become a target number. Therefore, the speed (delay amount) at which the drawing-off unit 120 (current source CRS) draws off charge from the parasitic capacitance Cp and selected capacitance elements Cs can be kept constant between multiple cases (e.g., cases I to III) different in the number of selected capacitance elements Cdn. As a result, the gradient of decrease in the potential on the signal line SL can be made constant between multiple cases different in the number of selected capacitance elements Cdn, and thus it is easy to delay the timing at which the potential on the signal line SL crosses the circuit threshold Vth of the output inverter INV2 by a linear delay amount. Further, since the gradient of decrease in the potential on the signal line SL can be made constant, variation in delay value due to the speed of on-off operation in the output inverter INV2 can be suppressed, and thus a timing difference created by the potential VSL on the signal line SL can be propagated, as it is, to the clock signal on the output side. Therefore, the adjustment amount of the duty ratio is hardly likely to be affected by variation in delay value in the output inverter INV2, so that tolerance to process variation can be improved.

Note that the output inverter INV2 may be a Schmitt inverter.

Further, the selecting unit 111 may select and activate capacitance elements Cs to be used for adjustment of the rising edge timing of the clock signal from among the multiple capacitance elements Cs[0] to Cs[n]. For example, each capacitance element Cs[0] to Cs[n] may have one end connected to the signal line SL and the other end connected to a corresponding switch SW1. Each switch SW1[0] to SW1[$n$] may have one end connected to a corresponding capacitance element Cs and the other end connected to the reference potential (e.g., ground potential). Each switch SW1[0] to SW1[$n$] turns on to connect a corresponding capacitance element Cs to the reference potential, thereby activating it and turns off to electrically disconnect the corresponding capacitance element Cs from the reference potential, thereby deactivating it. The deactivated capacitance element Cs is in a floating state, so that charge hardly flows into it via the signal line SL. Thus, the selecting unit 111 can select capacitance elements Cs to be used for adjustment of edge timings.

Yet further, the selecting unit 112 may select and activate capacitance elements Cdn to be used for adjustment of the rising edge timing of the clock signal from among the multiple capacitance elements Cdn[0] to Cdn[n]. For example, each capacitance element Cdn[0] to Cdn[n] may have one end connected to the signal line SL and the other end connected to a corresponding switch SW2. Each switch SW2[0] to SW2[$n$] may have one end connected to a corresponding capacitance element Cdn and the other end connected to the reference potential (e.g., ground potential). Each switch SW2[0] to SW2[n] turns on to connect a corresponding capacitance element Cdn to the reference potential, thereby activating it and turns off to electrically disconnect the corresponding capacitance element Cdn from the reference potential, thereby deactivating it. The deactivated capacitance element Cdn is in a floating state, so that charge hardly flows into it via the signal line SL. Thus, the selecting unit 112 can select capacitance elements Cdn to be used for adjustment of edge timings.

Figure 5:
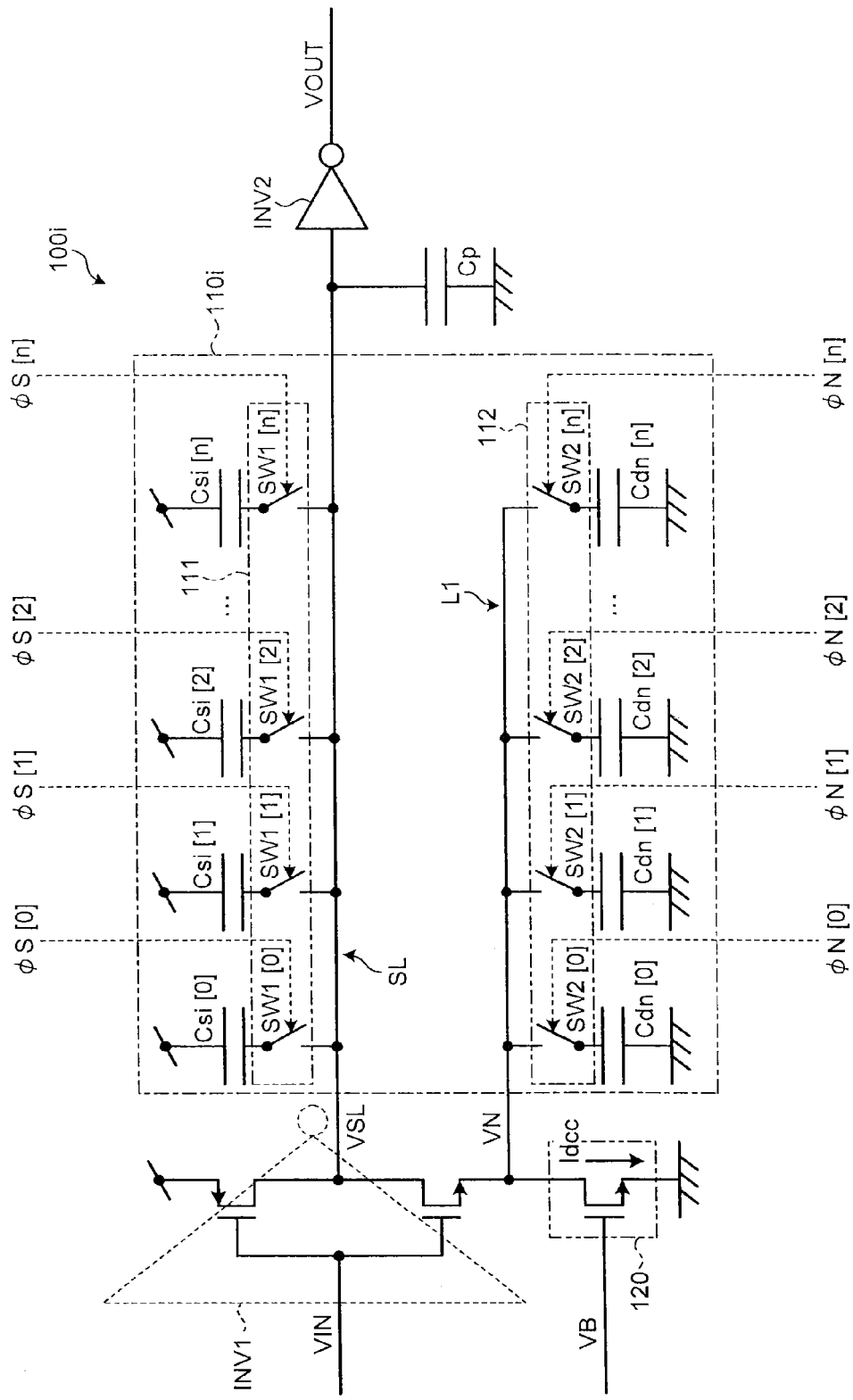
FIG. 5 is a diagram showing the configuration of a duty cycle correction circuit according to a modified example of the first embodiment.

Or, as shown in FIG. 5, in a charge distribution unit 110i of a duty cycle correction circuit 100i, multiple capacitance elements Csi[0] to Csi[n] may be provided on the power-supply-potential side, not on the reference potential (e.g., ground potential) side. Each capacitance element Csi[0] to Csi[n] may have one end connected to a corresponding switch SW1 and the other end connected to a power supply potential (e.g., Vdd). Although it performs substantially the same operation as the duty cycle correction circuit 100 shown in FIG. 3, the duty cycle correction circuit 100i shown in FIG. 5 can operate more stably in the case where the setting of the duty ratio (i.e., the bit values of the control signals φS, φN) is switched during clock operation.

Figure 6:
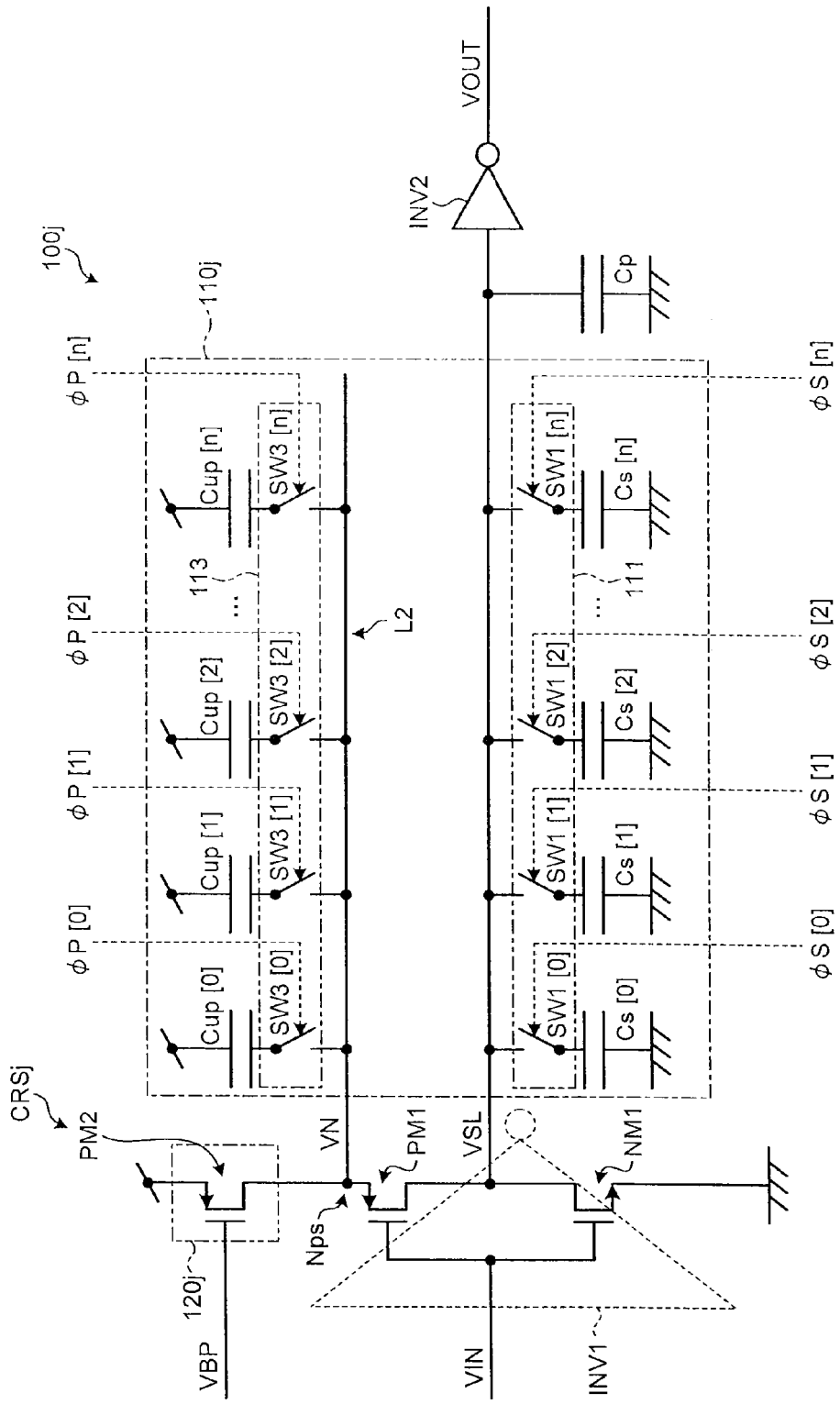
FIG. 6 is a diagram showing the configuration of a duty cycle correction circuit according to another modified example of the first embodiment.

Or, as shown in FIG. 6, a duty cycle correction circuit 100j may be configured to adjust the falling edge timing of the clock signal. In this case, the duty cycle correction circuit 100j has a charge distribution unit 110j and a drawing-off unit 120j instead of the charge distribution unit 110 and the drawing-off unit 120 (see FIG. 3).

The charge distribution unit 110j distributes charge (negative charge) to selected capacitance elements among multiple capacitance elements Cs[0] to Cs[n] and multiple capacitance elements Cup[0] to Cup[n] when the PMOS transistor PM1 is turned on. For example, the charge distribution unit 110j has the multiple capacitance elements (second capacitance elements) Cup[0] to Cup[n] and a selecting unit (second selecting unit) 113 instead of the capacitance elements Cdn[0] to Cdn[n] and the selecting unit 112 (see FIG. 3). The selecting unit 113 selects capacitance elements Cup to be used for adjustment of falling edge timings of the clock signal from among the multiple capacitance elements Cup[0] to Cup[n] to connect via a line L2 to the node Nps on the source side of the PMOS transistor PM1 according to a control signal φP[0] to φP[n]. The selecting unit 113 has multiple switches (second switches) SW3[0] to SW3[n].

It should be noted that the term "distributing charge" (charge distributing operation) includes changing the storage amount of at least one of the positive charge and negative charge in each electrode by moving charge between electrodes of the capacitance elements Cup[0] to Cup[n] and electrodes of the capacitance elements Cs[0] to Cs[n]. Further, the term "distributing charge" (charge distributing operation) also includes changing, by a substantially zero change amount, the storage amount of each of the positive charge and negative charge of each electrode when there is almost no charge movement between electrodes of the capacitance elements Cup[0] to Cup[n] and electrodes of the capacitance elements Cs[0] to Cs[n].

The drawing-off unit 120j charges positive charge into selected capacitance elements with the distributed charge (negative charge) as a base while the PMOS transistor PM1 is maintained to be on. In other words, the drawing-off unit 120j draws off their distributed charge (negative charge) from selected capacitance elements while the PMOS transistor PM1 is maintained to be on. For example, the drawing-off unit 120j has a current source CRSj. The current source CRSj draws off charge (negative charge) from selected capacitance elements to discharge into a power supply potential (e.g., Vdd). The current source CRSj has a PMOS transistor PM2.

Note that the term "distributed charge" includes each of the positive charge and negative charge in the electrodes of the capacitance elements Cup[0] to Cup[n] and capacitance elements Cs[0] to Cs[n] on which the aforementioned charge distributing operation has been performed.

Second Embodiment

Next, a semiconductor device 1k including the duty cycle correction circuit 100 according to the second embodiment will be described. Description will be made below focusing on the differences from the first embodiment.

Although in the first embodiment the duty ratio can be adjusted in only one direction, in the second embodiment, the duty cycle correction circuits 100 are connected in series, so that the duty ratio can be adjusted in a minus direction by the duty cycle correction circuit 100-1 of the first stage and in a plus direction by the duty cycle correction circuit 100-2 of the second stage.

Figure 7:
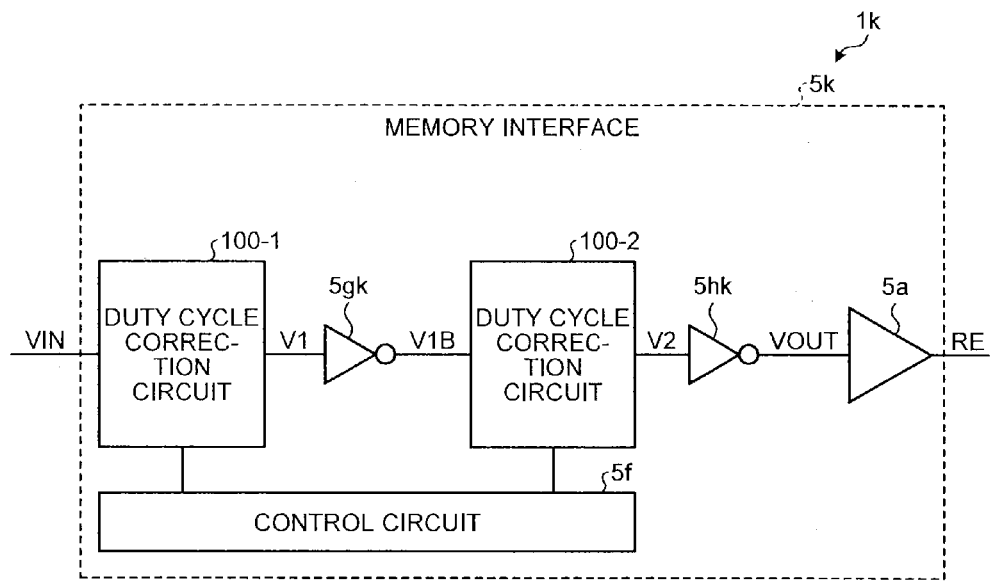
FIG. 7 is a diagram showing the configuration of a semiconductor device including a duty cycle correction circuit according to a second embodiment.

Specifically, the semiconductor device 1k has a memory interface 5k instead of the memory interface 5 (see FIG. 2). FIG. 7 is a diagram showing part of the configuration of the memory interface 5k in the semiconductor device 1k. The memory interface 5k has the multiple duty cycle correction circuits 100-1, 100-2 and multiple inverters 5gk, 5hk instead of the duty cycle correction circuit 100 (see FIG. 2).

The duty cycle correction circuit (first duty cycle correction circuit) 100-1 receives the clock signal VIN from the clock generator 2 and adjusts the rising edge timing of the clock signal according to control signals φS-1, φN-1 from a control circuit 5f to output an adjusted clock signal V1. The inverter 5gk logically inverts the clock signal V1 to generate an inverted clock signal V1B. The duty cycle correction circuit (second duty cycle correction circuit) 100-2 receives the inverted clock signal V1B and adjusts the rising edge timing of the inverted clock signal according to control signals φS-2, φN-2 from the control circuit 5f to output an adjusted inverted clock signal V2. At this time, since adjusting the rising edge timing of the inverted clock signal, the duty cycle correction circuit 100-2 can equivalently adjust the falling edge timing of the clock signal. The inverter 5hk logically inverts the inverted clock signal V2 to generate a clock signal VOUT and supplies to a driver 5a.

For example, if it is desired to make the duty ratio of the clock signal VOUT to be supplied to the driver 5a smaller, operation as shown in FIGS. 8A to 8E is performed. That is, the control circuit 5f has the duty cycle correction circuit 100-1 delay the rising edge timing of the clock signal by the delay amount according to the amount by which the duty ratio is desired to be reduced. In FIGS. 8B to 8E, similar cases I, II, III to in the first embodiment, are indicated by a broken line, a dot-dashed line, and a solid line respectively. The FIGS. 8A to 8E are diagrams showing the operation of the semiconductor device 1k when it is desired to make the duty ratio of the clock signal VOUT smaller.

Figure 8:
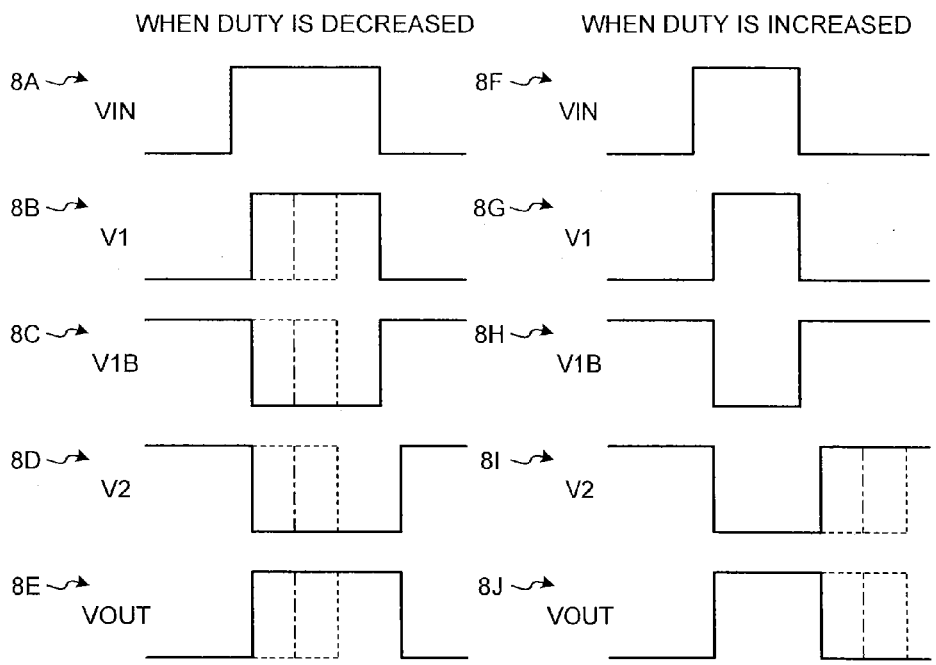
FIG. 8 is a diagram showing the operation of the semiconductor device including the duty cycle correction circuit according to the second embodiment.

Or, for example, if it is desired to make the duty ratio of the clock signal VOUT to be supplied to the driver 5a greater, operation as shown in FIGS. 8F to 8J is performed. That is, the control circuit 5f has the duty cycle correction circuit 100-2 delay the falling edge timing of the clock signal by the delay amount according to the amount by which the duty ratio is desired to be increased. In FIGS. 8I, 8J, similar cases I, II, III to in the first embodiment, are indicated by a broken line, a dot-dashed line, and a solid line respectively. The FIGS. 8F to 8J are diagrams showing the operation of the semiconductor device 1k when it is desired to make the duty ratio of the clock signal VOUT greater.

It should be noted that, if the delay amount is set at substantially zero in the duty cycle correction circuits 100-1, 100-2, ideally the potential VSL on the signal line SL immediately after the clock signal VIN becomes the H level, should be substantially equal to the circuit threshold Vth of the output inverter INV2, but in reality VSL is greater than Vth, so that there is a certain degree of delay (a delay until VSL reaches Vth). With the one-stage configuration, the influence of this delay on the duty ratio cannot be ignored, but with the two-stage configuration, both the rising edge timing and the falling edge timing are delayed by substantially the same time period, and hence the influences of these operation delays on the duty ratio of the clock signal VOUT can be made to cancel out so as not to appear.

As described above, in the second embodiment, in the semiconductor device 1k, the duty cycle correction circuit 100-1, inverter 5gk, and duty cycle correction circuit 100-2 are connected in series. Thus, the rising edge timing of the clock signal can be adjusted by the duty cycle correction circuit 100-1 of the first stage, and the falling edge timing of the clock signal can be adjusted by the duty cycle correction circuit 100-2 of the second stage. Therefore, the duty ratio of the clock signal VOUT to be supplied to the driver 5a can be adjusted linearly in both the plus and minus directions, so that the duty ratio can be adjusted highly accurately in both the plus and minus directions.

Third Embodiment

Next, a semiconductor device 1p including the duty cycle correction circuit 100 according to the third embodiment will be described. Description will be made below focusing on the differences from the second embodiment.

In the second embodiment, not only an edge timing on which timing adjustment is performed but also the opposite edge timing (e.g., the falling edge timings of V1, V2) affects the duty ratio of the clock signal VOUT. To avoid this, the swing of the potential VSL on the signal line SL of FIG. 4 needs to be a full swing from the power supply potential Vdd to ground potential. Hence, the current value Idcc of the current source CRS needs to be made greater, or the capacitance value of the capacitance elements Cs, Cdn need to be made smaller, resulting in a restriction on enlarging the feasible range of duty cycle correction by the duty cycle correction circuit 100.

Figure 9:
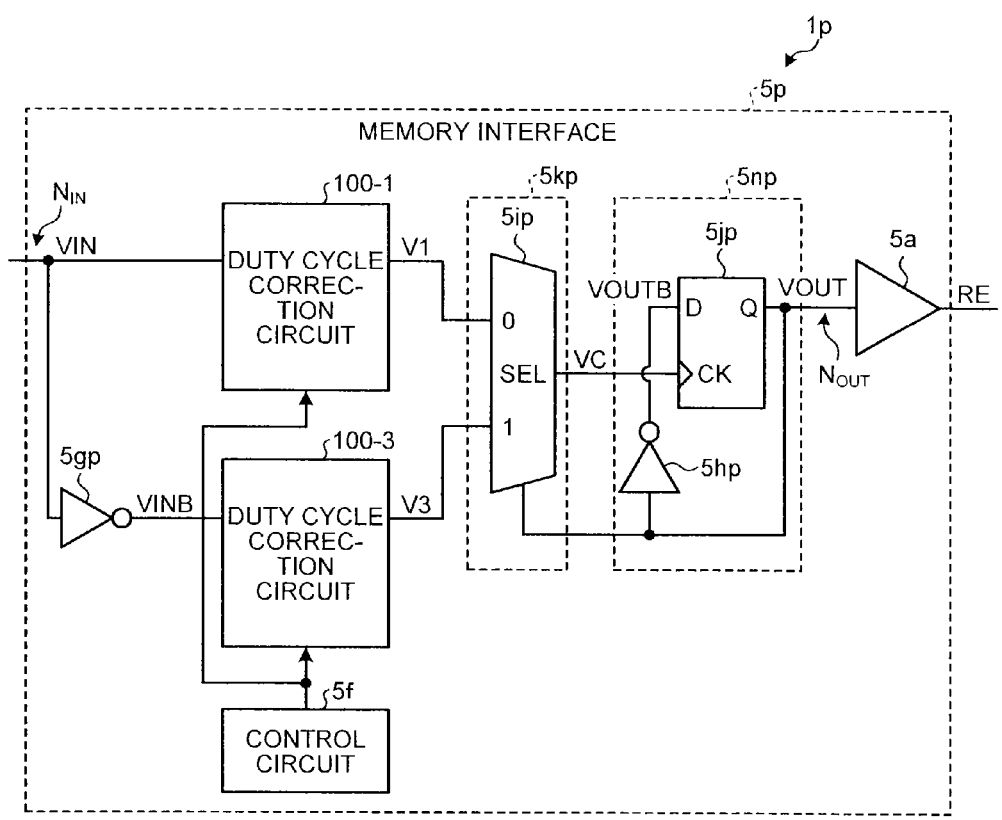
FIG. 9 is a diagram showing the configuration of a semiconductor device including a duty cycle correction circuit according to a third embodiment.
Figure 10:
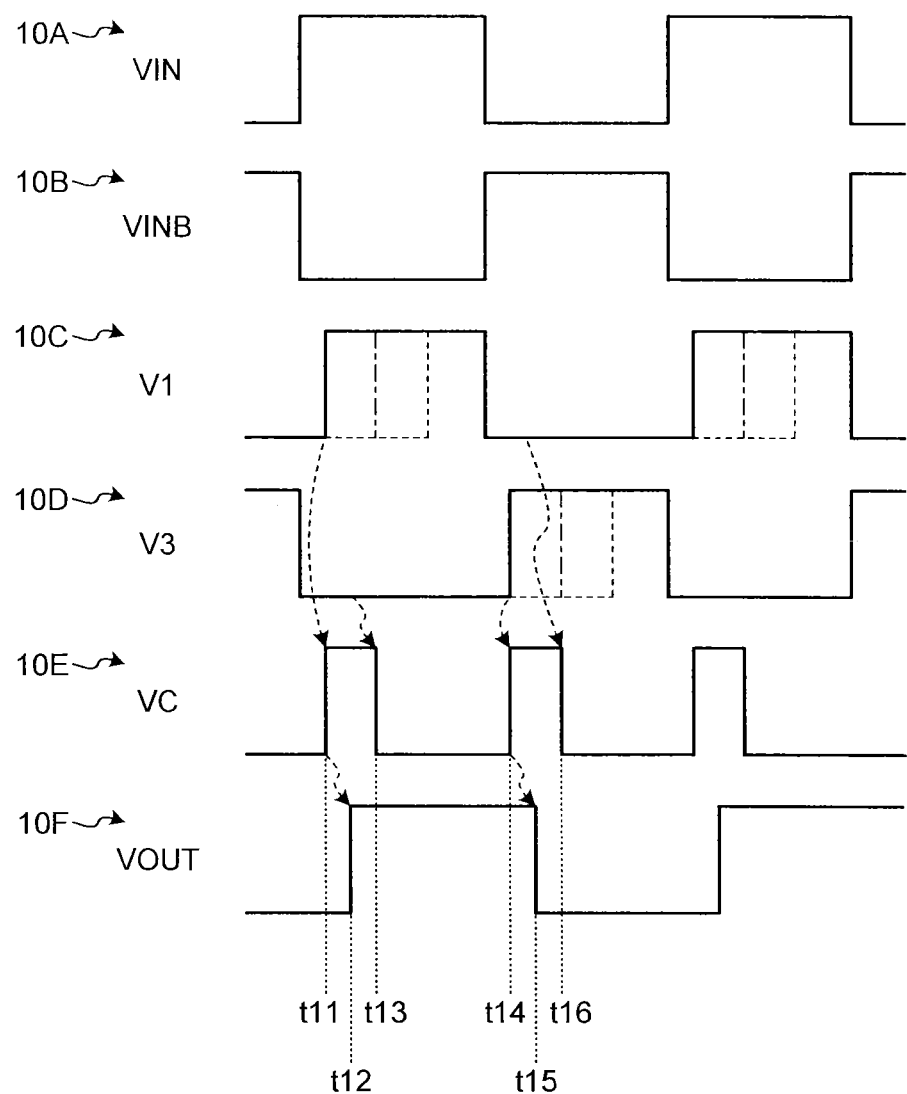
FIG. 10 is a diagram showing the operation of the semiconductor device including the duty cycle correction circuit according to the third embodiment.

Accordingly, in the third embodiment, in the semiconductor device 1p, multiple duty cycle correction circuits 100-1, 100-3 are connected in parallel between an input node Nin and an output node Nout as shown in FIG. 9. FIG. 9 is a diagram showing the configuration of the semiconductor device 1p.

Specifically, the semiconductor device 1p has a memory interface 5p instead of the memory interface 5k (see FIG. 7). FIG. 9 is a diagram showing part of the configuration of the memory interface 5p. The memory interface 5p has the multiple duty cycle correction circuits 100-1, 100-3, an inverter 5gp, a selecting unit 5kp, and a generating unit 5np instead of the duty cycle correction circuit 100 (see FIG. 2).

The duty cycle correction circuit (first duty cycle correction circuit) 100-1 receives the clock signal VIN from the clock generator 2 and adjusts the rising edge timing of the clock signal according to control signals φS, φN from a control circuit 5f to output an adjusted clock signal V1.

The inverter 5gp receives the clock signal VIN from the clock generator 2 to logically invert to generate an inverted clock signal VINB. The duty cycle correction circuit (third duty cycle correction circuit) 100-3 receives the inverted clock signal VINB from the inverter 5gp and adjusts the rising edge timing of the inverted clock signal according to control signals φS-3, φN-3 from the control circuit 5f to output an adjusted inverted clock signal V3.

The selecting unit 5kp selects the output (clock signal V1) of the duty cycle correction circuit 100-1 at a first timing and the output (inverted clock signal V3) of the duty cycle correction circuit 100-3 at a second timing to generate an intermediate signal VC. The selecting unit 5kp has a selector 5ip. The selector 5ip receives the clock signal VOUT as a selecting signal. The selector 5ip selects the output of the duty cycle correction circuit 100-1 during the time when the clock signal VOUT is at the L level (a bit value of 0) and the output of the duty cycle correction circuit 100-3 during the time when the clock signal VOUT is at the H level (a bit value of 1).

The generating unit 5np generates an adjusted clock signal VOUT using the generated intermediate signal VC. The generating unit 5np has a flip-flop 5jp and an inverter 5hp. The inverter 5hp logically inverts the output VOUT of the flip-flop 5jp to generate a signal VOUTB and supply it to a data input terminal D. The flip-flop 5jp receives the intermediate signal VC at its clock terminal CK and the signal VOUTB at its data input terminal D. Thus, the generating unit 5np can generate the adjusted clock signal VOUT according to the generated intermediate signal VC.

For example, the semiconductor device 1p performs operation as shown in FIGS. 10A to 10F.

At timing t11, since the selector 5ip is selecting the clock signal V1, the intermediate signal VC rises from the L level to the H level synchronously with the rising edge of the clock signal V1.

The flip-flop 5jp starts holding the signal VOUTB synchronously with the rising edge of the intermediate signal VC and at timing t12 toggles its output (the clock signal VOUT) from the L level to the H level.

At timing t13, the selector 5ip is selecting the inverted clock signal V3 according to the clock signal VOUT being at the H level, so that the intermediate signal VC falls from the H level to the L level.

At timing t14, the selector 5ip is selecting the inverted clock signal V3, so that the intermediate signal VC rises from the L level to the H level synchronously with the rising edge of the inverted clock signal V3.

The flip-flop 5jp starts holding the signal VOUTB synchronously with the rising edge of the intermediate signal VC and at timing t15 toggles its output (the clock signal VOUT) from the H level to the L level.

At timing t16, the selector 5ip is selecting the clock signal V1 according to the clock signal VOUT being at the L level, so that the intermediate signal VC falls from the H level to the L level.

As described above, in the third embodiment, in the semiconductor device 1p, the duty cycle correction circuit 100-1 adjusts the duty ratio of the clock signal VIN to generate the clock signal V1, and the duty cycle correction circuit 100-3 adjusts the duty ratio of the inverted clock signal VINB to generate the inverted clock signal V3. The selecting unit 5kp selects the output of the duty cycle correction circuit 100-1 at the first timing and the output of the duty cycle correction circuit 100-3 at the second timing to generate the intermediate signal VC. The generating unit 5np generates the adjusted clock signal VOUT using the generated intermediate signal VC. Because the intermediate signal VC is generated on the rising edge timings of the clock signals V1, V2, the deviations of the falling edge timings of the clock signal V1 output from the duty cycle correction circuit 100-1 and of the clock signal V3 output from the duty cycle correction circuit 100-3 hardly affects the duty ratio of the clock signal VOUT. Therefore, in the duty cycle correction circuits 100-1, 100-3, it is possible to make the gradient of the potential VSL on the signal line SL more gradual than in the second embodiment, resulting in an increase in the adjustment range of the duty ratio. Thus, in the semiconductor device 1p, the adjustment range of the duty ratio can be widened, and the duty ratio can be adjusted also against greater deviations of the duty ratio.

Fourth Embodiment

Next, a duty cycle correction circuit 100q according to the fourth embodiment will be described. Description will be made below focusing on the differences from the first embodiment.

Although in the first embodiment control is performed so that the sum of the number of capacitance elements Cs connected to the signal line SL side and the number of capacitance elements Cdn connected to the node Ns side becomes constant, in the fourth embodiment with the number of capacitance elements Cs connected to the signal line SL side being fixed, the number of capacitance elements Cdn on the node Ns side is switched.

Figure 11:
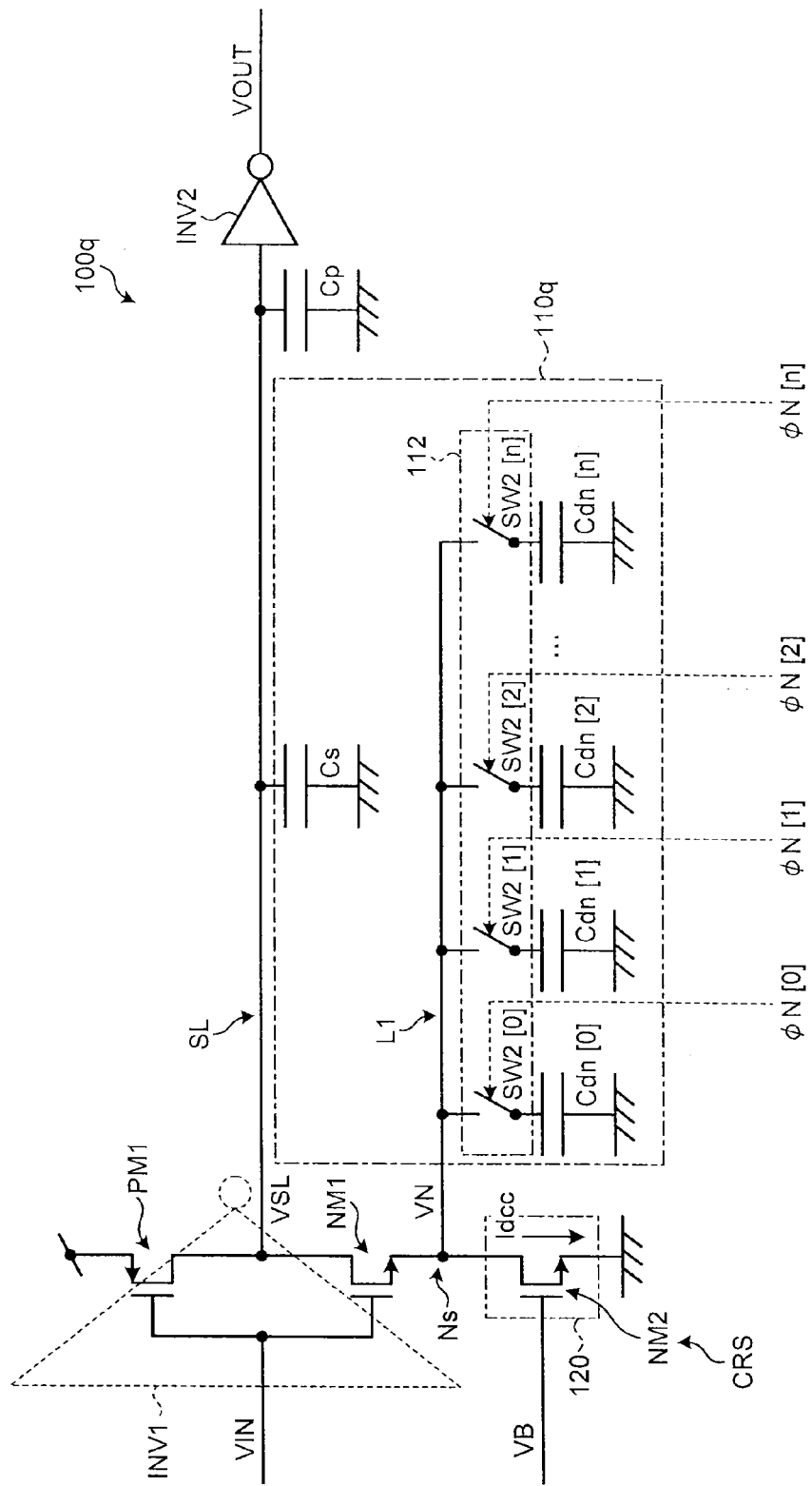
FIG. 11 is a diagram showing the configuration of a duty cycle correction circuit according to a fourth embodiment.

Specifically, the duty cycle correction circuit 100q has a charge distribution unit 110q instead of the charge distribution unit 110 (see FIG. 3) as shown in FIG. 11. The charge distribution unit 110q does not have the selecting unit 111 (see FIG. 3) and has a capacitance element Cs instead of the capacitance elements Cs[0] to Cs[n] (see FIG. 3). The capacitance element Cs has one end fixedly connected to the signal line SL and the other end connected to a reference potential (e.g., ground potential).

The selecting unit 112 selects capacitance elements Cdn to be used for adjustment of the rising edge timing of the clock signal from among the multiple capacitance elements Cdn[0] to Cdn[n] to connect via a line L1 to a node Ns on the source side of the NMOS transistor NM1. The current source CRS of the drawing-off unit 120 draws off charge (positive charge) from capacitance elements at a speed (delay amount) according to capacitance that is seen on the drain side, that is, the total capacitance of the selected capacitance elements. Hence, the greater the number of selected capacitance elements Cdn is, at the slower speed (greater delay amount) charge is drawn off from the capacitance elements Cdn.

For example, the duty cycle correction circuit 100q operates as shown in FIGS. 12A to 12C. Here, description will be made assuming that the circuit threshold Vth is about half of the power supply voltage Vdd (Vth≈Vdd/2) and that n*Cdn is set to be as large in magnitude as Cs+Cp (n*Cdn≈Cs+Cp), but the practical usage is not limited to this.

At timing t21, the distribution of charge (positive charge) can be performed according to which capacitance elements Cdn are selected by the selecting unit 112. In case I, charge distribution is hardly performed, so that the potential on the signal line SL remains at the power supply potential Vdd (H level) without changing, as indicated by a broken line in FIG. 12B. In case II, part of charge stored in the parasitic capacitance Cp of the signal line SL and the capacitance element Cs moves into the k/2 number of capacitance elements Cdn, thereby performing charge distribution. Thus, the potential on the signal line SL takes on an intermediate value between the power supply potential Vdd and the circuit threshold Vth of the output inverter INV2 (see Equation 7) as indicated by a dot-dashed line in FIG. 12B. In case III, part of charge stored in the parasitic capacitance Cp of the signal line SL and the capacitance element Cs moves into the k number of capacitance elements Cdn, thereby performing charge distribution. Thus, the potential on the signal line SL can become substantially equal to the circuit threshold Vth of the output inverter INV2 as indicated by a solid line in FIG. 12B, and immediately thereafter the current source CRS draws off charge from the capacitance elements, so that the potential on the SL crosses the circuit threshold Vth of the INV2, and hence the level of the clock signal VOUT rises from the L level to the H level as indicated by a solid line in FIG. 12C.

Immediately after timing t21, the current source CRS starts drawing off charge (positive charge) from the parasitic capacitance Cp, the capacitance element Cs, and the selected capacitance elements Cdn in parallel at a speed (delay amount) according to the total capacitance of the selected capacitance elements Cdn. In case I, charge is drawn off at a first speed according to the total capacitance of the parasitic capacitance Cp and the capacitance element Cs as indicated by a broken line in FIG. 12B. In case II, charge is drawn off at a second speed according to the total capacitance of the parasitic capacitance Cp, the capacitance element Cs, and k/2 number of capacitance elements Cdn as indicated by a dot-dashed line in FIG. 12B. The second speed is slower than the first speed, which indicates that the potential VSL on the signal line SL decreases at a gradient more gradual than in case I. In case III, charge is drawn off at a third speed according to the total capacitance of the parasitic capacitance Cp, the capacitance element Cs, and k number of capacitance elements Cdn as indicated by a solid line in FIG. 12B. The third speed is slower than the second speed, which indicates that the potential VSL on the signal line SL decreases at a gradient more gradual than in case II.

At timing t22, in case I, the potential on the signal line SL is higher than the circuit threshold Vth as indicated by the broken line in FIG. 12B. In case II, the potential on the signal line SL crosses the circuit threshold Vth as indicated by the dot-dashed line in FIG. 12B, and the level of the clock signal VOUT rises from the L level to the H level as indicated by the dot-dashed line in FIG. 12C. In case III, the potential on the signal line SL has already crossed the circuit threshold Vth in a descending direction as indicated by the solid line in FIG. 12B.

At timing t23, in case I, the potential on the signal line SL crosses the circuit threshold Vth as indicated by the broken line in FIG. 12B, and the level of the clock signal VOUT rises from the L level to the H level as indicated by the broken line in FIG. 12C. In case II, the potential on the signal line SL has already crossed the circuit threshold Vth in a descending direction as indicated by the dot-dashed line in FIG. 12B. In case III, the potential on the signal line SL has already crossed the circuit threshold Vth in a descending direction as indicated by the solid line in FIG. 12B.

Here, comparing cases I to III, the number of selected capacitance elements Cdn is increased from zero (case I)→k/2 (case II)→k (case III). Accordingly the delay amount of the rising timing of the clock signal VOUT relative to the rising timing of the clock signal VIN is adjusted linearly, proportionally to the number, from ΔTdly×k (case I)→ΔTdly×k/2 (case II)→zero (case III). That is, the duty ratio of the clock signal VOUT is adjusted linearly, proportionally to the number of selected capacitance elements Cdn.

It should be noted that ΔTdly can be obtained as follows. Letting j be the number of selected capacitance elements Cdn, Cs be the capacitance value of the capacitance element Cs, Cp be the capacitance value of the parasitic capacitance Cp, Cdn be the capacitance value of the capacitance element Cdn, and V1 be the potential on the signal line SL when the potential VSL on the signal line SL substantially equals the potential VN on the node Ns, the following equation 6 holds.

$$(Cs+Cp)*Vdd=(Cs+Cp+j*Cdn)*V1 \quad \text{Eq. 6}$$

When the equation 6 is solved for V1, the following equation 7 is obtained.

$$V1=(Cs+Cp)*Vdd/(Cs+Cp+j*Cdn) \quad \text{Eq. 7}$$

Here, letting Idcc denote current flowing through the current source CRS and Tdly denote the delay amount of the rising timing of the clock signal VOUT relative to the rising timing of the clock signal VIN, the following equation 8 holds.

$$\begin{aligned} Tdly &= (V1-Vth)*(Cs+Cp+j*Cdn)/Idcc \\ &= (Cs+Cp)*(Vdd-Vth)/Idcc - j*Cdn*Vth/Idcc \end{aligned} \quad \text{Eq. 8}$$

Then, letting Tdly' denote the delay amount when the number of selected capacitance elements Cdn is j−1, the following equation 9 holds.

$$Tdly'=(Cs+Cp)*(Vdd-Vth)/Idcc-(j-1)*Cdn*Vth/Idcc \quad \text{Eq. 9}$$

The variation width ΔTdly, a delay amount per capacitance element, can be given by the following equation 10 obtained from the equations 8 and 9.

$$\begin{aligned} \Delta Tdly &= Tdly' - Tdly \\ &= Cdn*Vth/Idcc \end{aligned} \quad \text{Eq. 10}$$

As expressed in the equation 10, the variation width ΔTdly of the delay amount is an amount that does not depend on the number j of capacitance elements Cdn. That is, it is seen from the equation 10 that the delay amount of the rising timing of the clock signal VOUT relative to the rising timing of the clock signal VIN can be adjusted by variation widths ΔTdly linearly to the number of selected capacitance elements Cdn. The magnitude of the variation width ΔTdly can be controlled through the capacitance value Cdn of the capacitance element Cdn and the amount Idcc of current flowing through the current source CRS.

The adjustment range of the duty ratio can be obtained as follows. The minimum value Tdly(min) of the delay amount is given by the following equation 11 obtained by substituting j=n into the equation 8.

$$Tdly(\text{min})=(Cs+Cp)*(Vdd-Vth)/Idcc-n*Cdn*Vth/Idcc \approx 0 \quad \text{Eq. 11}$$

In the equation 11, it is assumed that the circuit threshold Vth is about half of the power supply voltage Vdd (Vth≈Vdd/2) and that n*Cdn is set to be as large in magnitude as Cs+Cp (n*Cdn≈Cs+Cp). The maximum value Tdly(max) of the delay amount is given by the following equation 12 obtained by substituting j=0 into the equation 8.

$$Tdly(\text{max})=(Cs+Cp)*(Vdd-Vth)/Idcc \quad \text{Eq. 12}$$

The adjustment range of the duty ratio is given by the following equation 13 obtained from the equations 11 and 12.

$$Tdly(\text{max})-Tdly(\text{min})=(Cs+Cp)*(Vdd-Vth)/Idcc \quad \text{Eq. 13}$$

As shown by the equation 13, The adjustment range of the duty ratio can be as large as Tdly(max), and hence it is seen that a wide adjustment range of the duty ratio can be easily secured.

As described above, in the fourth embodiment, in the duty cycle correction circuit 100q, the charge distribution unit 110q distributes charge to the capacitance element Cs and selected ones of the multiple capacitance elements Cdn when the NMOS transistor NM1 of the input inverter INV1 is turned on. The selecting unit 112 adjusts the edge timings of the clock signal according to the total capacitance of the selected capacitance elements Cdn. The drawing-off unit 120 draws off their distributed charge from the selected capacitance elements Cdn while the NMOS transistor NM1 is maintained to be on. Thus, the timing at which the potential on the signal line SL crosses the circuit threshold Vth of the output inverter INV2 can be delayed by a linear delay amount according to the total capacitance of the selected capacitance elements Cdn. As a result, the rising edge timing of the clock signal output from the output inverter INV2 can be delayed by a linear delay amount, and thus the duty ratio of the clock signal output from the output inverter INV2 can be adjusted linearly.

Further, in the fourth embodiment, in the duty cycle correction circuit 100q, the potential on the signal line SL is lowered immediately after the NM1 is turned on by an amount according to the number of selected capacitance elements Cdn, and then the potential on the signal line SL is lowered at a different speed depending on the number of selected capacitance elements Cdn. Therefore, it is easy to have a wide adjustment range of the duty ratio as in the first embodiment.

Fifth Embodiment

Next, a duty cycle correction circuit 100r according to the fifth embodiment will be described. Description will be made below focusing on the differences from the fourth embodiment.

Although in the fourth embodiment the duty ratio can be adjusted in a minus direction with the one-stage configuration, in the fifth embodiment the duty ratio can be adjusted in both plus and minus directions with the one-stage configuration.

Figure 13:
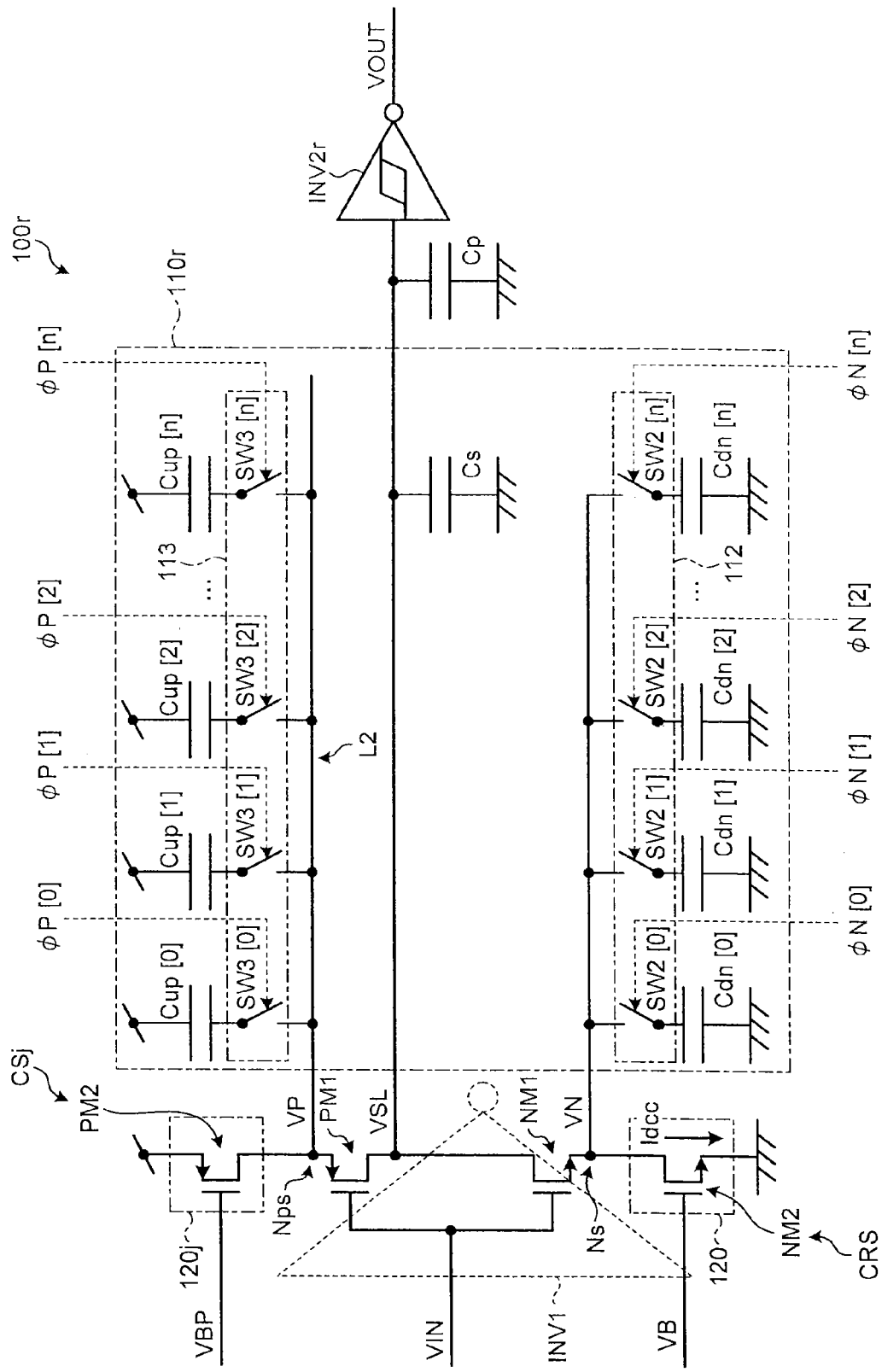
FIG. 13 is a diagram showing the configuration of a duty cycle correction circuit according to a fifth embodiment.

Specifically, the duty cycle correction circuit 100r has an output inverter INV2r and a charge distribution unit 110r instead of the output inverter INV2 and the charge distribution unit 110 (see FIG. 3) as shown in FIG. 13 and further has a drawing-off unit 120j. FIG. 13 is a diagram showing the configuration of the duty cycle correction circuit 100r.

The output inverter INV2r is a Schmitt inverter. Accordingly, it is easy to make the potential VSL on the signal line SL when the transistor PM1 (NM1) is turned on not cross the circuit threshold Vth.

The charge distribution unit 110r distributes charge (negative charge) to the capacitance element Cs and selected ones of multiple capacitance elements Cup[0] to Cup[n] when the PMOS transistor PM1 is turned on. For example, the charge distribution unit 110r further has the multiple capacitance elements (second capacitance elements) Cup[0] to Cup[n] and a selecting unit (second selecting unit) 113. The selecting unit 113 selects capacitance elements Cup to be used for adjustment of the falling edge timing of the clock signal from among the multiple capacitance elements Cup[0] to Cup[n] according to a control signal φP[0] to φP[n] to connect via a line L2 to a node Nps on the source side of the PMOS transistor PM1. The selecting unit 113 has multiple switches (second switches) SW3[0] to SW3[n].

The drawing-off unit 120j draws off their distributed charge (negative charge) from the selected capacitance elements while the PMOS transistor PM1 is maintained to be on. For example, the drawing-off unit 120j has a current source CRSj. The current source CRSj draws off charge (negative charge) from selected capacitance elements to discharge into a power supply potential (e.g., Vdd). The current source CRSj has a PMOS transistor PM2.

Figure 14:
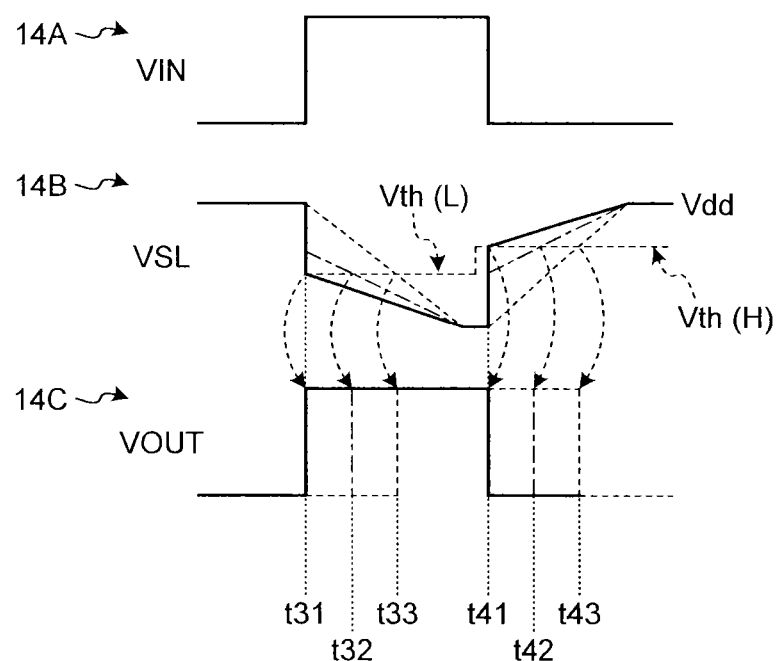
FIG. 14 is a diagram showing the operation of the duty cycle correction circuit according to the fifth embodiment.

For example, the duty cycle correction circuit 100r operates as shown in FIGS. 14A to 14C. FIG. 14 is a diagram showing the operation of the duty cycle correction circuit 100r. In FIG. 14B, since the output inverter INV2r is a Schmitt inverter, the threshold Vth(H) of the ascending direction is higher than the threshold Vth(L) of the descending direction.

Figure 12:
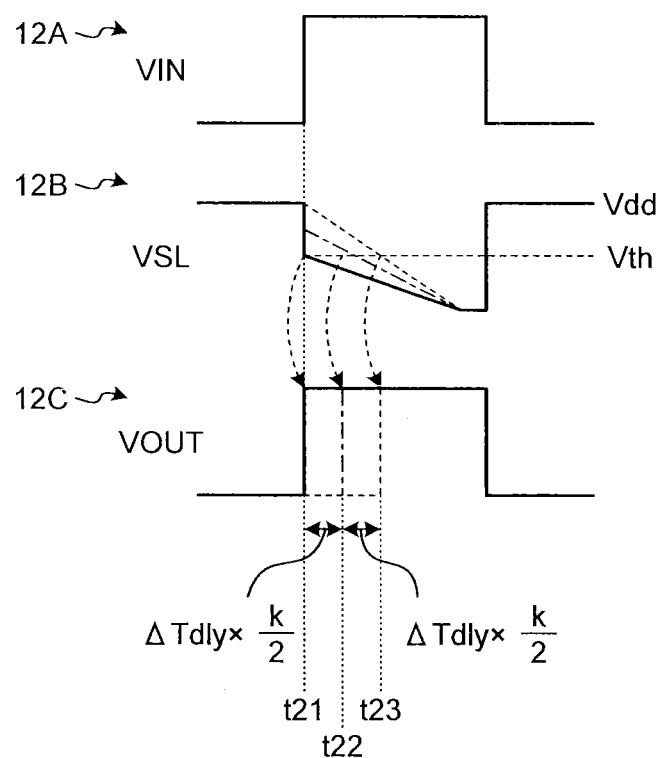
FIG. 12 is a diagram showing the operation of the duty cycle correction circuit according to the fourth embodiment.

At timings t31 to t33, similar operation is performed to at timings t21 to t23 in the fourth embodiment (see FIG. 12). It is supposed that since the circuit threshold Vth varies, the magnitudes of parameters such as the capacitance elements Cup, Cdn are adjusted to be at appropriate values accordingly.

At timing t41, the distribution of charge (negative charge) can be performed according to which capacitance elements Cup are selected by the selecting unit 113. In case I, charge distribution is hardly performed, so that the potential on the signal line SL remains at the reference potential (L level) without changing, as indicated by a broken line in FIG. 14B. In case II, part of charge stored in the parasitic capacitance Cp of the signal line SL and the capacitance element Cs moves into the k/2 number of capacitance elements Cup, thereby performing charge distribution. Thus, the potential on the signal line SL takes on an intermediate value between the reference potential Vdd and the circuit threshold Vth(H) of the output inverter INV2r as indicated by a dot-dashed line in FIG. 14B. In case III, part of charge stored in the parasitic capacitance Cp of the signal line SL and the capacitance element Cs moves into the k number of capacitance elements Cup, thereby performing charge distribution. Thus, the potential on the signal line SL becomes substantially equal to the circuit threshold Vth(H) of the output inverter INV2 as indicated by a solid line in FIG. 14B, and immediately thereafter the current source CRSj draws off negative charge from the capacitance elements, so that the potential on the SL exceeds the circuit threshold Vth(H) of the INV2, and hence the level of the clock signal VOUT falls from the H level to the L level as indicated by a solid line in FIG. 14C.

Immediately after timing t41, the current source CRSj starts drawing off charge (negative charge) from the parasitic capacitance Cp, the capacitance element Cs, and the selected capacitance elements Cup in parallel at a speed (delay amount) according to the total capacitance of the selected capacitance elements Cup. In case I, charge is drawn off at a fourth speed according to the total capacitance of the parasitic capacitance Cp and the capacitance element Cs as indicated by the broken line in FIG. 14B. In case II, charge is drawn off at a fifth speed according to the total capacitance of the parasitic capacitance Cp, the capacitance element Cs, and k/2 number of capacitance elements Cup as indicated by the dot-dashed line in FIG. 14B. The fifth speed is slower than the fourth speed, which indicates that the potential VSL on the signal line SL increases at a gradient more gradual than in case I. In case III, charge is drawn off at a sixth speed according to the total capacitance of the parasitic capacitance Cp, the capacitance element Cs, and k number of capacitance elements Cup as indicated by the solid line in FIG. 14B. The sixth speed is slower than the fifth speed, which indicates that the potential VSL on the signal line SL increases at a gradient more gradual than in case II.

At timing t42, in case I, the potential on the signal line SL is lower than the circuit threshold Vth(H) as indicated by the broken line in FIG. 14B. In case II, the potential on the signal line SL crosses the circuit threshold Vth(H) as indicated by the dot-dashed line in FIG. 14B, and the level of the clock signal VOUT falls from the H level to the L level as indicated by a dot-dashed line in FIG. 14C. In case III, the potential on the signal line SL has already crossed the circuit threshold Vth in an ascending direction as indicated by the solid line in FIG. 14B.

At timing t43, in case I, the potential on the signal line SL crosses the circuit threshold Vth(H) as indicated by the broken line in FIG. 14B, and the level of the clock signal VOUT falls from the H level to the L level as indicated by a broken line in FIG. 14C. In case II, the potential on the signal line SL has already crossed the circuit threshold Vth in an ascending direction as indicated by the dot-dashed line in FIG. 14B. In case III, the potential on the signal line SL has already crossed the circuit threshold Vth in an ascending direction as indicated by the solid line in FIG. 14B.

Here, comparing cases I to III, the number of selected capacitance elements Cup is increased from zero (case I)→k/2 (case II)→k (case III). Accordingly the delay amount of the falling timing of the clock signal VOUT relative to the falling timing of the clock signal VIN is adjusted linearly, proportionally to the number, from $\Delta Tdly \times k$ (case I)→$\Delta Tdly \times k/2$ (case II)→zero (case III). That is, the duty ratio of the clock signal VOUT is adjusted linearly, proportionally to the number of selected capacitance elements Cup.

As described above, in the fifth embodiment the duty ratio can be adjusted in both plus and minus directions with the duty cycle correction circuit 100r of the one-stage configuration, and thus the power consumption of the semiconductor device can be reduced as compared with the case where the duty ratio is adjusted in both plus and minus directions with the duty cycle correction circuits of the two-stage configuration.

Sixth Embodiment

Next, a duty cycle correction circuit 100s according to the sixth embodiment will be described. Description will be made below focusing on the differences from the modified example shown in FIG. 5 of the first embodiment.

In the modified example shown in FIG. 5 of the first embodiment, the variation width $\Delta Tdly$ of the delay amount may vary under the influence of variation in the power supply potential Vdd as shown in the equation 5. In the sixth embodiment, the duty cycle correction circuit is configured to suppress the influence of variation in the power supply potential Vdd on the variation width $\Delta Tdly$ of the delay amount.

Figure 15:
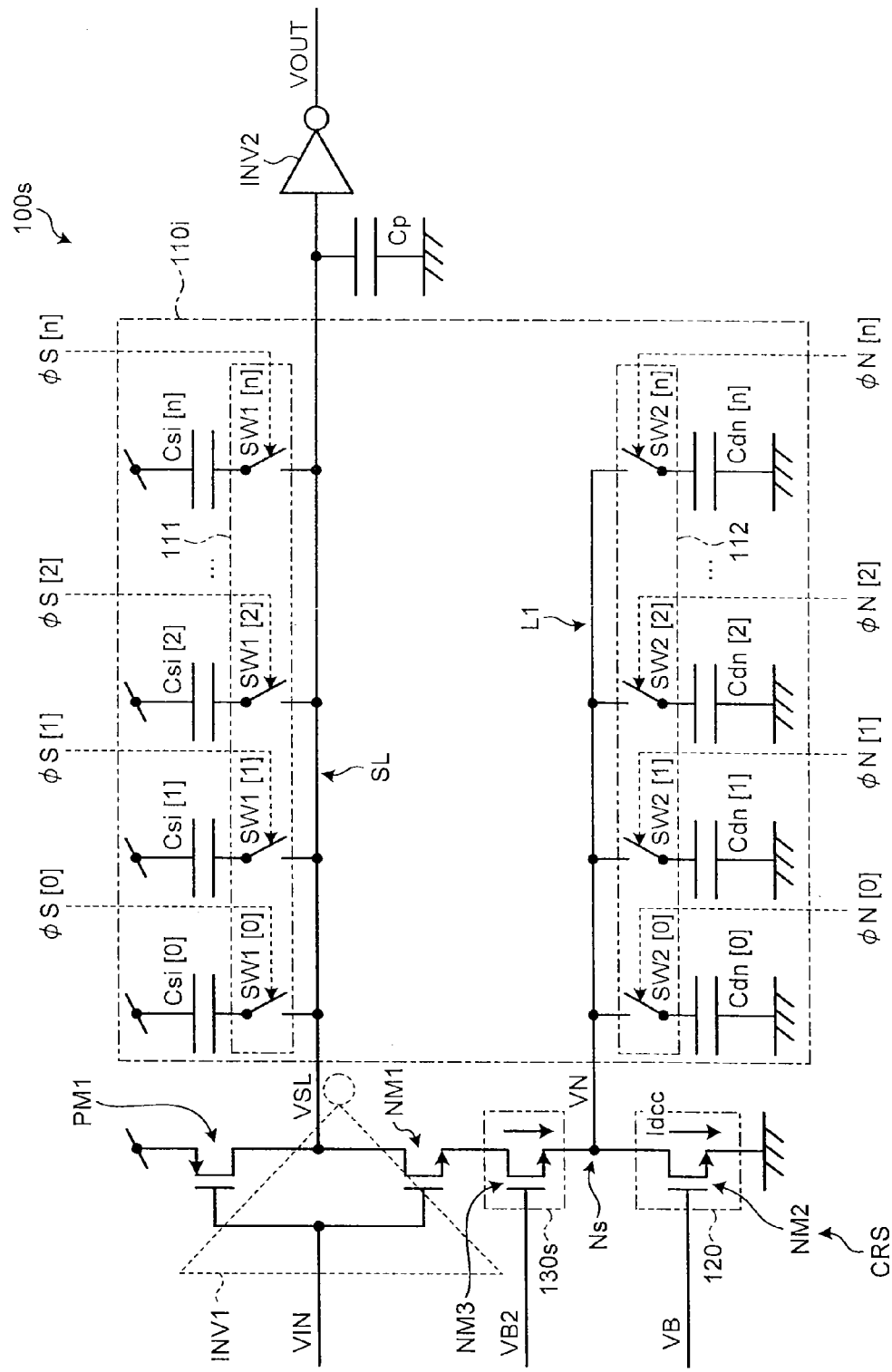
FIG. 15 is a diagram showing the configuration of a duty cycle correction circuit according to a sixth embodiment.

Specifically, the duty cycle correction circuit 100s further comprises a potential limiting unit 130s as shown in FIG. 15. FIG. 15 is a diagram showing the configuration of the duty cycle correction circuit 100s. The potential limiting unit 130s is provided between the source of the NMOS transistor NM1 and the current source CRS and limits the potential on the node Ns between the potential limiting unit 130s and the current source CRS. The potential limiting unit 130s has an NMOS transistor NM3. The NMOS transistor NM3, receiving a bias voltage VB2 at its gate, operates to limit the potential on the node Ns to Vnmax (=VB2−Vth(nmos)) or lower (see FIG. 16B), where Vth(nmos) is its threshold voltage. Vnmax is a potential between the circuit threshold Vth of the output inverter INV2 and the reference potential (L level). That is, the bias voltage VB2 is set such that Vnmax takes on a potential between the circuit threshold Vth of the output inverter INV2 and the reference potential (L level). The bias voltage VB2 does not depend on the power supply voltage Vdd, and thus Vnmax is not dependent on the power supply voltage either. The bias voltage VB2 is, for example, a fixed bias with a fixed potential. As far as the operation of the potential limiting unit 130s is concerned, the linearity of the adjustment of the delay amount in the duty cycle correction circuit 100s is kept, even if the circuit threshold Vth is lower than the potential Vnmax.

For example, the duty cycle correction circuit 100s operates as shown in FIGS. 16A to 16C. FIG. 16 is a diagram showing the operation of the duty cycle correction circuit 100s.

At timing t51, the distribution of charge (positive charge) can be performed according to which capacitance elements are selected by the selecting unit 111 and 112, so that the potential on the signal line SL can change to a different value. At this time, the potential on the node Ns rises to be closer to the potential on the signal line SL as indicated by a two-dot chain line in FIG. 16B, but is limited to the potential Vnmax by the potential limiting unit 130s (NMOS transistor NM3).

Immediately after timing t51, if there is a difference between the potential VSL on the signal line SL and the potential VN on the node Ns, then there is a difference in voltage between the drain and source of the NMOS transistor NM3, and hence the current source CRS starts drawing off charge (positive charge) from the parasitic capacitance Cp and capacitance elements Cs in parallel at a speed (delay amount) according to the total capacitance of the selected capacitance elements Cs. At this time, substantially the same current flows through the potential limiting unit 130s (NMOS transistor NM3) and the current source CRS (NMOS transistor NM2). If charge is drawn off from capacitance elements Cdn, so that the potential on the node Ns becomes lower than the potential Vnmax, then current flowing through the potential limiting unit 130s (NMOS transistor NM3) can become greater because of its transistor characteristic, and thus electric charge is charged into the capacitance elements Cdn, so that the potential on the node Ns returns to the potential Vnmax. Thus, drawing off charge from capacitance elements Cdn is not substantially executed, and hence the current source CRS draws off charge at a speed (delay amount) according to the total capacitance of the parasitic capacitance Cp and the selected capacitance elements Cs.

In case I, charge is drawn off at a seventh speed according to the total capacitance of the parasitic capacitance Cp and k number of capacitance elements Cs as indicated by a broken line in FIG. 16B. In case II, charge is drawn off at an eighth speed according to the total capacitance of the parasitic capacitance Cp and k/2 number of capacitance elements Cs as indicated by a dot-dashed line in FIG. 16B. The eighth speed is faster than the seventh speed, which indicates that the potential VSL on the signal line SL decreases at a gradient steeper than in case I. In case III, charge is drawn off at a ninth speed according to the capacitance of the parasitic capacitance Cp as indicated by a solid line in FIG. 16B. The ninth speed is faster than the eighth speed, which indicates that the potential VSL on the signal line SL decreases at a gradient steeper than in case II.

Thereafter, in case III, at timing t52, the potential VSL on the signal line SL becomes substantially equal to the potential VN on the node Ns as indicated by the solid line in FIG. 16B, so that the source-to-drain voltage of the NMOS transistor NM3 is substantially 0 volts, and thus the NMOS transistor NM3 functions as a simple resistance. Therefore, the current source CRS starts drawing off charge from capacitance elements Cdn as well as the parasitic capacitance Cp and capacitance elements Cs.

In case II, at timing t53, the potential VSL on the signal line SL becomes substantially equal to the circuit threshold Vth of the output inverter INV2 as indicated by the dot-dashed line in FIG. 16B. Then, at timing t54, the potential VSL on the signal line SL becomes substantially equal to the potential VN on the node Ns, so that the source-to-drain voltage of the NMOS transistor NM3 is sufficiently small, and thus the NMOS transistor NM3 functions as a simple resistance. Therefore, the current source CRS starts drawing off charge from capacitance elements Cdn as well as the parasitic capacitance Cp and capacitance elements Cs.

In case I, at timing t55, the potential VSL on the signal line SL becomes substantially equal to the circuit threshold Vth of the output inverter INV2 as indicated by the broken line in FIG. 16B. Then, at timing t56, the potential VSL on the signal line SL becomes substantially equal to the potential VN on the node Ns, so that the source-to-drain voltage of the NMOS transistor NM3 is sufficiently 0 volts, and thus the NMOS transistor NM3 functions as a simple resistance. Therefore, the current source CRS starts drawing off charge from capacitance elements Cdn as well as the parasitic capacitance Cp and capacitance elements Cs.

Immediately after the timing when it starts drawing off charge from capacitance elements Cdn as well, the current source CRS starts drawing off charge from the parasitic capacitance Cp and selected capacitance elements Cs, Cdn to discharge into the reference potential (e.g., ground potential). In case I, charge is drawn off from each of k number of capacitance elements Cs. In case II, charge is drawn off from each of k/2 number of capacitance elements Cs and k/2 number of capacitance elements Cdn. In case III, charge is drawn off from each of k number of capacitance elements Cdn. Letting C be the capacitance values of each capacitance element Cs and of each capacitance element Cdn, the total capacitance that is seen on the drain side of the current source CRS is denoted as k×C in each of cases I to III and substantially the same between cases I to III. Hence, the potential VSL on the signal line SL decreases at substantially the same gradient between cases I to III as indicated by the broken line, dot-dashed line, and solid line in FIG. 16B.

It should be noted that ΔTdly can be obtained as follows. Letting i be the number of selected capacitance elements Cs, j be the number of selected capacitance elements Cdn, Cs be the capacitance value of the capacitance element Cs, Cdn be the capacitance value of the capacitance element Cdn, and V1 be the potential on the signal line SL immediately after the NM1 is turned on, the following equation 14 holds.

$$i*Cs*Vdd = i*Cs*V1 + j*Cdn*Vnmax \quad \text{Eq. 14}$$

When the equation 14 is solved for V1, the following equation 15 is obtained.

$$V1 = Vdd - Vnmax*j*Cdn/(i*Cs) \quad \text{Eq. 15}$$

Here, letting Idcc denote current flowing through the current source CRS and Tdly denote the delay amount of the rising timing of the clock signal VOUT relative to the rising timing of the clock signal VIN, the following equation 16 holds.

$$Tdly = (V1 - Vth)*i*Cs/Idcc \quad \text{Eq. 16}$$
$$= i*Cs*(Vdd - Vth)/Idcc - j*Cdn*Vnmax/Idcc$$

Then, letting Tdly' denote the delay amount when the number of selected capacitance elements Cs is i+1 and the number of selected capacitance elements Cdn is j−1, the following equation 17 holds.

$$Tdly' = (i+1)*Cs*(Vdd-Vth)/Idcc - (j-1)*Cdn*Vn\text{max}/Idcc \qquad \text{Eq. 17}$$

The variation width ΔTdly, a delay amount per capacitance element, can be given by the following equation 18 obtained from the equations 16 and 17, assuming that Cs=Cdn.

$$\Delta Tdly = Tdly' - Tdly \qquad \text{Eq. 18}$$
$$= Cs*(Vdd - Vth + Vn\text{max})/Idcc$$

Although the equations 5 and 10 have only Vdd-dependent terms (Vth is also dependent on Vdd), the equation 18 has a Vnmax term not dependent on Vdd. It can be seen that the influence of variation in the power supply potential Vdd on the variation width ΔTdly of the delay amount can be suppressed accordingly due to the presence of the Vnmax term.

As described above, in the sixth embodiment, in the duty cycle correction circuit 100s, the potential limiting unit 130s limits the potential on the node Ns. By this means, the influence of variation in the power supply potential Vdd on the variation width ΔTdly of the delay amount can be suppressed, and therefore it is further easy to linearly adjust the duty ratio of the clock signal output from the output inverter INV2.

If the concept of the sixth embodiment is applied to the configuration shown in FIG. 6, a potential limiting unit is provided between the source of the PMOS transistor PM1 and the current source CRSj and is configured to limit the potential on the node Nps between the potential limiting unit and the current source CRSj. In this case, the potential limiting unit limits the potential on the node Nps to a potential between the circuit threshold Vth of the output inverter INV2 and the power supply potential (H level) or higher. Also by this means, the influence of variation in the power supply potential Vdd on the variation width ΔTdly of the delay amount can be suppressed, and therefore it is further easy to linearly adjust the duty ratio of the clock signal output from the output inverter INV2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A duty cycle correction circuit comprising:
an input inverter that includes a PMOS transistor and an NMOS transistor and receives a clock signal;
an output inverter that outputs a clock signal according to a signal transmitted via a signal line from the input inverter;
a charge distribution unit that distributes, when one transistor of the PMOS transistor and the NMOS transistor is turned on, charge to capacitance elements selected from among one or more first capacitance elements placed on side of the signal line and among a plurality of second capacitance elements disposed on side of source of the one transistor; and
a drawing-off unit that draws off the distributed charge from the selected capacitance elements while the one transistor is maintained to be on.

2. The duty cycle correction circuit according to claim 1, wherein the charge distribution unit has:
a plurality of the first capacitance elements disposed on the side of the signal line;
a first selecting unit that selects first capacitance elements to be used for duty cycle adjustment from among the plurality of first capacitance elements to connect to the signal line;
the plurality of second capacitance elements; and
a second selecting unit that selects second capacitance elements to be used for duty cycle adjustment from among the plurality of second capacitance elements to connect to a node on the side of the source of the one transistor.

3. The duty cycle correction circuit according to claim 2, wherein the first selecting unit has a plurality of first switches corresponding to the plurality of first capacitance elements, and
wherein the second selecting unit has a plurality of second switches corresponding to the plurality of second capacitance elements.

4. The duty cycle correction circuit according to claim 3, wherein
the plurality of first switches connect selected first capacitance elements from among the plurality of first capacitance elements to the signal line, and
wherein the plurality of second switches connect selected second capacitance elements from among the plurality of second capacitance elements to a node on the side of the source of the one transistor.

5. The duty cycle correction circuit according to claim 4, wherein
each of the plurality of first capacitance elements has one end connected to the first switch and other end connected to a reference potential or a power supply potential, and
wherein each of the plurality of second capacitance elements has one end connected to the second switch and other end connected to a reference potential or a power supply potential.

6. The duty cycle correction circuit according to claim 2, wherein
the first selecting unit and the second selecting unit adjust edge timings of a clock signal according to at least total capacitance of selected second capacitance elements.

7. The duty cycle correction circuit according to claim 6, wherein
the first selecting unit and the second selecting unit select capacitance elements to be used for duty cycle adjustment such that sum of total capacitance of selected first capacitance elements and total capacitance of selected second capacitance elements becomes a target value.

8. The duty cycle correction circuit according to claim 7, wherein
each of the plurality of first capacitance elements and each of the plurality of second capacitance elements have substantially a same capacitance, and
wherein the first selecting unit and the second selecting unit select capacitance elements to be used for duty cycle adjustment such that sum of number of selected first capacitance elements and number of selected second capacitance elements becomes a target number.

9. The duty cycle correction circuit according to claim 7, wherein
the drawing-off unit includes a current source that draws off the distributed charge.

10. The duty cycle correction circuit according to claim 1, wherein
the charge distribution unit has:
the first capacitance element connected to the signal line;
the plurality of second capacitance elements; and
a second selecting unit that selects second capacitance elements to be used for duty cycle adjustment of edge timings of a clock signal from among the plurality of second capacitance elements to connect to a node on the side of the source of the one transistor.

11. The duty cycle correction circuit according to claim 10, wherein
the second selecting unit has a plurality of second switches corresponding to the plurality of second capacitance elements.

12. The duty cycle correction circuit according to claim 11, wherein
the first capacitance element has one end connected to the signal line and other end connected to a reference potential or a power supply potential, and
wherein each of the plurality of second capacitance elements has one end connected to the second switch and other end connected to a reference potential or a power supply potential.

13. The duty cycle correction circuit according to claim 1, wherein
the drawing-off unit has a current source that draws off the distributed charge, and
wherein the duty cycle correction circuit further comprises a potential limiting unit that limits a potential on a node between the source of the one transistor and the current source.

14. The duty cycle correction circuit according to claim 13, wherein
the potential limiting unit includes a transistor that receives a fixed bias at a gate thereof.

15. The duty cycle correction circuit according to claim 1, wherein
the output inverter is a Schmitt circuit.

16. A semiconductor device comprising:
a clock generator that generates a clock signal;
a first duty cycle correction circuit that is the duty cycle correction circuit according to claim 1 and receives the clock signal from the clock generator;
an inverter that logically inverts a clock signal output from the first duty cycle correction circuit to generate an inverted clock signal; and
a second duty cycle correction circuit that is the duty cycle correction circuit according to claim 1 and receives the inverted clock signal.

17. A semiconductor device comprising:
a clock generator that generates a clock signal;
a first duty cycle correction circuit that is the duty cycle correction circuit according to claim 1 and receives the clock signal from the clock generator;
an inverter that receives the clock signal from the clock generator and logically inverts to generate an inverted clock signal;
a third duty cycle correction circuit that is the duty cycle correction circuit according to claim 1 and receives the inverted clock signal;
a selecting unit that selects an output of the first duty cycle correction circuit at a first timing and an output of the third duty cycle correction circuit at a second timing to generate an intermediate signal; and
a generating unit that generates an adjusted clock signal using the generated intermediate signal.

18. A semiconductor device comprising:
a clock generator that generates a clock signal;
the duty cycle correction circuit according to claim 1 that receives the clock signal from the clock generator and adjusts duty ratio of the received clock signal to supply to a memory;
a receiver circuit that receives a strobe signal according to the supplied clock signal from the memory;
a duty cycle detection circuit that detects duty ratio of the received strobe signal; and
a control circuit that controls operation of the duty cycle correction circuit so that duty ratio detected by the duty cycle detection circuit takes on a target value.

19. A duty cycle correction circuit comprising:
an input inverter that includes a PMOS transistor and an NMOS transistor and receives a clock signal;
an output inverter that outputs a clock signal according to a signal transmitted via a signal line from the input inverter;
a charge distribution unit that distributes charge to second capacitance elements selected from among a plurality of second capacitance elements disposed on side of source of the NMOS transistor when the NMOS transistor is turned on and distributes charge to third capacitance elements selected from among a plurality of third capacitance elements disposed on side of source of the PMOS transistor when the PMOS transistor is turned on;
a first drawing-off unit that draws off the distributed charge from the selected second capacitance elements while the NMOS transistor is maintained to be on; and
a second drawing-off unit that draws off the distributed charge from the selected third capacitance elements while the PMOS transistor is maintained to be on.

20. The duty cycle correction circuit according to claim 19, wherein
the output inverter is a Schmitt circuit.

* * * * *